(12) United States Patent
Kato

(10) Patent No.: US 7,344,997 B2
(45) Date of Patent: Mar. 18, 2008

(54) SEMICONDUCTOR SUBSTRATE, SEMICONDUCTOR DEVICE, METHOD FOR MANUFACTURING SEMICONDUCTOR SUBSTRATE AND METHOD FOR MANUFACTURING SEMICONDUCTOR DEVICE

(75) Inventor: Juri Kato, Nagano-Ken (JP)

(73) Assignee: Seiko Epson Corporation, Tokyo (JP)

( * ) Notice: Subject to any disclaimer, the term of this patent is extended or adjusted under 35 U.S.C. 154(b) by 281 days.

(21) Appl. No.: 11/192,898

(22) Filed: Jul. 28, 2005

(65) Prior Publication Data
US 2006/0220128 A1 Oct. 5, 2006

(30) Foreign Application Priority Data
Jul. 29, 2004 (JP) ............... 2004-221413

(51) Int. Cl.
H01L 21/469 (2006.01)
(52) U.S. Cl. ............ 438/735; 438/751; 438/494; 257/E21.214

(58) Field of Classification Search ........... 438/40, 438/494, 498, 735, 737, 738, 751, 752; 257/E21.214, 257/E21.316
See application file for complete search history.

(56) References Cited

U.S. PATENT DOCUMENTS 5,114,876 A * 5/1992 Weiner ............... 117/53

FOREIGN PATENT DOCUMENTS

JP 07-225410 8/1995
JP 2003-158091 5/2003

* cited by examiner

Primary Examiner—Howard Weiss
Assistant Examiner—(Vikki) Hoa B Trinh
(74) Attorney, Agent, or Firm—John J. Penny, Jr.; Edwards Angell Palmer & Dodge LLP

(57) ABSTRACT

A semiconductor substrate comprising a semiconductor base, a dielectric layer formed in at least a part of an area on the semiconductor base, and a single crystal semiconductor layers having mutually different film thicknesses, disposed on the dielectric layer and formed by epitaxial growth.

3 Claims, 26 Drawing Sheets

SEMICONDUCTOR SUBSTRATE, SEMICONDUCTOR DEVICE, METHOD FOR MANUFACTURING SEMICONDUCTOR SUBSTRATE AND METHOD FOR MANUFACTURING SEMICONDUCTOR DEVICE

BACKGROUND OF THE INVENTION

1. Technical Field

The present invention relates to semiconductor substrates, semiconductor devices, methods for manufacturing semiconductor substrates, and methods for manufacturing semiconductor devices, and it is particularly suitable for application to field effect transistors formed on a SOI (Silicon On Insulator) substrate.

2. Description of Related Art

The utilities of field effect transistors formed on a SOI substrate are attracting attention because of their readiness of element isolation, latch-up free characteristics, small source/drain junction capacitances and the like.

Also, for example, Japanese Laid-open Patent Application HEI 7-225410 (JP '410) describes a method of forming high breakdown voltage field effect transistors on a SOI substrate. Also, Japanese Laid-open Patent Application 2003-158091 (JP '091) describes a method of forming field effect transistors that are miniaturized on the other of submicron on a SOI substrate.

It is noted here that optimum film thicknesses of SOI layers differ for semiconductor elements of different usages. In other words, for a high breakdown voltage field effect transistor subjected to application of a high voltage load, its SOI layer needs to have a larger film thickness in order to secure the PN junction breakdown voltage, and the film thickness of the SOI layer amounts to the order of pm. For example, in the case of a high breakdown voltage field effect transistor having a drain breakdown voltage of about 100V, the film thickness of the SOI layer needs to be about several μm.

On the other hand, for a field effect transistor that is miniaturized on the order of submicron, its BOX layer needs to have a smaller film thickness in order to suppress punch-through leakage and reduction of threshold values by short-channel effects, and thus the film thickness of the BOX layer becomes to be on the order of several hundred angstrom. For example, when the effective channel length becomes 0.1 μm or less, the film thickness of the SOI layer needs to be set to 50 nm or less.

In the meantime, accompanied by the advent of ubiquitous societies, the SOC (System On Chip) technology that enables mix-mounting of devices of various breakdown voltages and digital and analog devices on a single chip is attracting attention, for further promotion of miniaturization of information portable devices, reduction of power consumption, greater multiple functions, and greater capacities.

Also, Japanese Laid-open Patent Application 2002-299591 (JP '591) describes a method of forming semiconductor elements for different usages in active layers having thicknesses suitable for the respective usages by embedding dielectric films at different depths from a main surface of a semiconductor substrate, in order to realize the SOC on a SOI substrate.

However, according to the methods described in JP '410 and JP '091, the film thickness of the BOX layer is maintained at constant by the SOI substrate. For this reason, for forming semiconductor elements for different usages on a SOI substrate, the semiconductor elements need to be independently formed on different SOI substrates for the respective usages, which causes a problem that presents an obstruction to realization of the SOC.

Also, according to the method described in JP '591, in order to embed dielectric films at different depths from the main surface of the semiconductor substrate, oxygen ions are injected in a silicon substrate with different energies. For this reason, physical damages are generated in the silicon substrate, and the crystallinity and purity of the SOI layer deteriorate, thereby causing a problem in that, when semiconductor elements are formed in the SOI layer, their characteristics deteriorate due to PN junction leakages or the like.

Furthermore, according to the method described in JP '591, when mask deviations occur between the BOX layer and the element isolation layer, lacks or duplicates may occur in the BOX layer. For this reason, the element isolating separations among semiconductor elements become greater, and characteristics of elements near the element isolation regions deteriorate, which causes problems in that the degree of integration of semiconductor elements becomes lower, and the reliability of the semiconductor elements becomes deteriorated.

SUMMARY OF THE INVENTION

It is thus an object of at least one embodiment of the present invention to provide semiconductor substrates, semiconductor devices, a method for manufacturing semiconductor substrates, and a method for manufacturing semiconductor devices, which can maintain the crystal quality of semiconductor layers, and are capable of forming semiconductor layers of mutually different film thicknesses on dielectric layers.

To solve the problems described above, a semiconductor substrate in accordance with an embodiment of the present invention comprises: a semiconductor base; a dielectric layer formed in at least a part of an area on the semiconductor base; and single crystal semiconductor layers having mutually different film thicknesses, disposed on the dielectric layer and formed by epitaxial growth.

By this, physical damages that may be inflicted on the single crystal semiconductor layers can be suppressed, and film thicknesses of the single crystal semiconductor layers can be set to match with the respective usages of semiconductor elements. For this reason, semiconductor elements for different usages can be formed on the single crystal semiconductor layers that have optimum film thicknesses, respectively, deterioration of the crystallinity and purity of the single crystal semiconductor layers can be suppressed, and junction leakages can be reduced while securing high level of mobility.

As a result, while short-channel effects can be suppressed, higher speed and further miniaturization of field effect transistors can be achieved, and while PN junction breakdown strength can be secured, high breakdown voltage field effect transistors can be formed on a common SOI substrate. For this reason, a System-On-Chip can be realized on a common SOI substrate, and miniaturization, lower power consumption, greater multiple functions and greater capacities of semiconductor devices can be promoted.

Also, a semiconductor substrate in accordance with an embodiment of the present invention comprises: a semiconductor base; a first dielectric layer formed in a first area on the semiconductor base; a first single crystal semiconductor layer formed on the first dielectric layer; a laminated layered structure of alternately laminated layers of different selection ratios at etching, formed in a second area on the semiconductor base; a second dielectric layer formed on the laminated layered structure; and a second single crystal semiconductor layer formed on the second dielectric layer.

By this, the second single crystal semiconductor layer can be disposed on the second dielectric layer that is formed on the laminated layered structure of alternately laminated semiconductor layers, and the first single crystal semiconductor layer can be disposed on the first dielectric layer that is directly formed on the semiconductor base. For this reason, heights of the first dielectric layer and the second dielectric layer disposed on the semiconductor base can be made different from each other, planarization can be achieved between the first single crystal semiconductor layer and the second single crystal semiconductor layer, and the first single crystal semiconductor layer and the second single crystal semiconductor layer can be made to have mutually different film thicknesses.

Also, a semiconductor device in accordance with an embodiment of the present invention comprises: a semiconductor substrate; a dielectric layer formed in a part of an area on the semiconductor substrate; a single crystal semiconductor layer disposed on the dielectric layer and formed by epitaxial growth; and semiconductor elements of mutually different usages formed in the semiconductor substrate and the single crystal semiconductor layer.

Also, a semiconductor device in accordance with an embodiment of the present invention comprises: a semiconductor substrate; a dielectric layer formed in a part of an area on the semiconductor substrate; single crystal semiconductor layers of mutually different film thicknesses, disposed on the dielectric layer and formed by epitaxial growth; and semiconductor elements of mutually different usages formed in the single crystal semiconductor layers.

By this, semiconductor elements do not need to be formed separately on independent SOI substrates for different usages, and semiconductor elements for different usages can be formed on single crystal semiconductor layers having optimum film thicknesses, respectively, such that greater performance of a system-on-chip can be achieved.

Also, a semiconductor device in accordance with an embodiment of the present invention comprises: a semiconductor substrate; a dielectric layer formed in a part of an area on the semiconductor substrate; single crystal semiconductor layers of mutually different film thicknesses, disposed on the dielectric layer and formed by epitaxial growth; and semiconductor elements of mutually different usages formed in the semiconductor substrate and the single crystal semiconductor layers of mutually different film thicknesses.

Also, the semiconductor device in accordance with an embodiment of the present invention further comprises element isolation regions for isolating the single crystal semiconductor layers in a horizontal direction, wherein the single crystal semiconductor layers of mutually different film thicknesses are disposed in a self-alignment manner between the element isolation regions.

By this, lacks or duplicates of single crystal semiconductor layers can be prevented, while film thicknesses of the single crystal semiconductor layers can be made mutually different for the respective usages of the semiconductor elements. For this reason, semiconductor elements for mutually different usages can be formed on a common SOI substrate, and higher integration and higher reliability of semiconductor elements can be achieved.

Also, the semiconductor device in accordance with an embodiment of the present invention is characterized in that a protection circuit or a trench memory cell is disposed in the semiconductor substrate, and among the single crystal semiconductor layers of mutually different film thicknesses, a completely depleted type field effect transistor is disposed in a single crystal semiconductor layer of a smaller film thickness, and a partially depleted type field effect transistor or bipolar transistor is disposed in a single crystal semiconductor layer of a greater film thickness.

By this, in a high-speed and low-power semiconductor element, when the effective channel length is 0.1 μm or less, the film thickness of the single crystal semiconductor layer can be made to be 50 nm or less, such that there can be provided a miniaturized transistor with higher performance and higher reliability whose short-channel effect can be suppressed. Also, in a transistor that is subjected to application of a high voltage load, the film thickness of the single crystal semiconductor layer can be made greater, such that a higher junction breakdown voltage and a greater current capacity can be secured, and a transistor of high breakdown voltage and large current with higher performance and higher reliability can be provided.

Also, a method for manufacturing a semiconductor substrate in accordance with an embodiment of the present invention comprises: a step of forming, on a semiconductor base, a first laminated layered structure composed of a second semiconductor layer having a smaller selection ratio at etching than a first semiconductor layer, laminated on the first semiconductor layer; a step of forming, in a part of an area on the first laminated layered structure, a second laminated layered structure composed of a fourth semiconductor layer having a smaller selection ratio at etching than a third semiconductor layer, laminated on the third semiconductor layer; a step of forming a first groove that penetrates the first semiconductor layer through the fourth semiconductor layer and exposes the semiconductor base; a step of forming a supporting body for supporting the second and fourth semiconductor layers on the semiconductor base on side walls of the first semiconductor layer through the fourth semiconductor layer in the first groove; a step of forming, in a first area divided by the first groove, a second groove that exposes at least a part of the first semiconductor layer through the second semiconductor layer; a step of forming, in a second area divided by the first groove, a third groove that exposes at least a part of the third semiconductor layer through the fourth semiconductor layer; a step of forming void sections under the second and fourth semiconductor layers by selectively etching the first and third semiconductor layers through the second groove and the third groove; and a step of forming dielectric layers disposed below the second and fourth semiconductor layers by thermally oxidizing the second and fourth semiconductor layers through the void sections.

By this, the second and fourth semiconductor layers can be supported on the semiconductor base through the supporting body formed in the first groove, the heights of the first and third semiconductor layers that are exposed through the second and fourth semiconductor layers, respectively, can be made different from each other in the first area and the second area, and etching gas or etching liquid can be brought in contact with the first and third semiconductor layers through the second groove and the third groove. For this reason, the second and fourth semiconductor layers can be stably supported on the semiconductor base, the first and third semiconductor layers disposed below the second and fourth semiconductor layers, respectively, can be removed, and the heights of the first and third semiconductor layers that are removed from below the second and fourth semiconductor layers, respectively, can be made different from each other in the first area and the second area. As a result, the heights of dielectric layers to be formed by thermal oxidation after the first and third semiconductor layers are removed can be made different in the first area and the second area, and the film thicknesses of the semiconductor layers in the first area and the second area can be made mutually different.

Also, a method for manufacturing a semiconductor substrate in accordance with an embodiment of the present invention is characterized in that the second semiconductor layer, the fourth semiconductor layer and the supporting body consist of single crystal Si, and the first semiconductor layer and the third semiconductor layer consist of single crystal SiGe.

By this, lattice matching of the first through fourth semiconductor layers and the supporting body can be made, and the selection ratio at the time of etching the first semiconductor layer and the third semiconductor layer can be made greater than that of the second semiconductor layer, the fourth semiconductor layer and the supporting body. For this reason, the second and fourth semiconductor layers of good crystal quality can be formed on the first and third semiconductor layers, respectively, the supporting body can be stably formed in the first groove, and single crystal semiconductor layers of mutually different film thicknesses can be formed in a common semiconductor substrate without damaging the quality of the second and fourth semiconductor layers.

Also, a method for manufacturing a semiconductor device in accordance with an embodiment of the present invention comprises: a step of forming, on a semiconductor substrate, a first laminated layered structure composed of a second semiconductor layer having a smaller selection ratio at etching than a first semiconductor layer, laminated on the first semiconductor layer; a step of forming, in a part of an area on the first laminated layered structure, a second laminated layered structure composed of a fourth semiconductor layer having a smaller selection ratio at etching than a third semiconductor layer, laminated on the third semiconductor layer; a step of forming a first groove that penetrates the first semiconductor layer through the fourth semiconductor layer and exposes the semiconductor substrate; a step of forming a supporting body for supporting the second and fourth semiconductor layers on the semiconductor substrate on side walls of the first semiconductor layer through the fourth semiconductor layer in the first groove; a step of forming, in a first area divided by the first groove, a second groove that exposes at least a part of the first semiconductor layer through the second semiconductor layer; a step of forming, in a second area divided by the first groove, a third groove that exposes at least a part of the third semiconductor layer through the fourth semiconductor layer; a step of forming void sections under the second and fourth semiconductor layers by selectively etching the first and third semiconductor layers through the second groove and the third groove; a step of forming dielectric layers disposed below the second and fourth semiconductor layers by thermally oxidizing the second and fourth semiconductor layers through the void sections; and a step of forming semiconductor elements of different usages under the second and fourth semiconductor layers, respectively.

By this, the heights of the dielectric layers disposed below the second and fourth semiconductor layers can be made different from each other without damaging the quality of the second and fourth semiconductor layers, and the second and fourth semiconductor layers of mutually different film thicknesses can be disposed in a self-alignment manner between element isolation regions. For this reason, while lacks or duplicates of the second and fourth semiconductor layers can be prevented, the film thicknesses of the second and fourth semiconductor layers can be made different from each other for individual usages of semiconductor elements, and semiconductor elements for mutually different usages can be formed on the second and fourth semiconductor layers, respectively, such that miniaturization, lower power consumption, greater multiple functions, greater capacities and higher level of reliability of system-on-chips can be achieved.

DESCRIPTION OF THE PREFERRED EMBODIMENTS

A semiconductor device and a method for manufacturing the same in accordance with embodiments of the present invention are described below with reference to the accompanying drawings.

Figure 1:
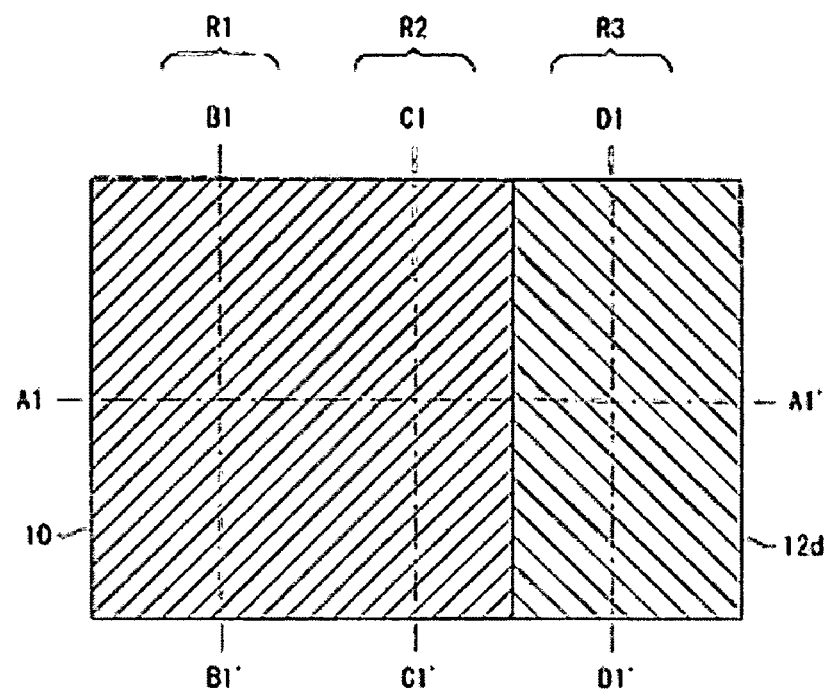
FIGS. 1(a)-1(b) are a plan view and a cross-sectional view showing a method for manufacturing a semiconductor device in accordance with an embodiment.
Figure 1:
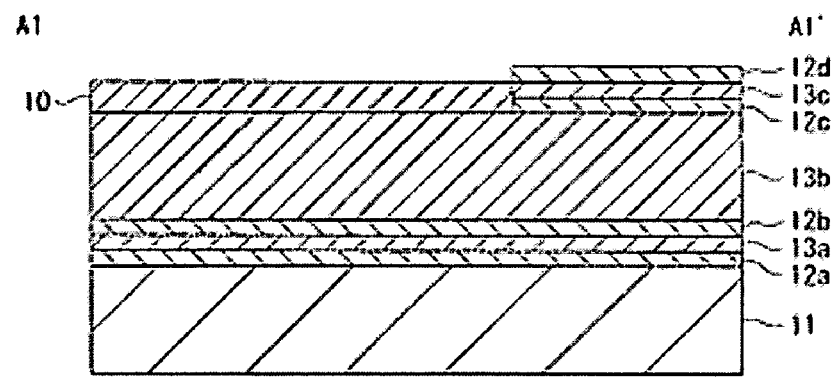
Figure 2:
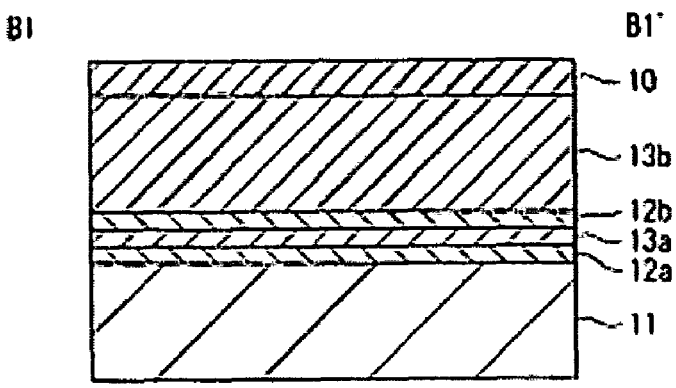
FIGS. 2(a)-2(c) are cross-sectional views showing the method for manufacturing the semiconductor device in accordance with an embodiment.
Figure 2:
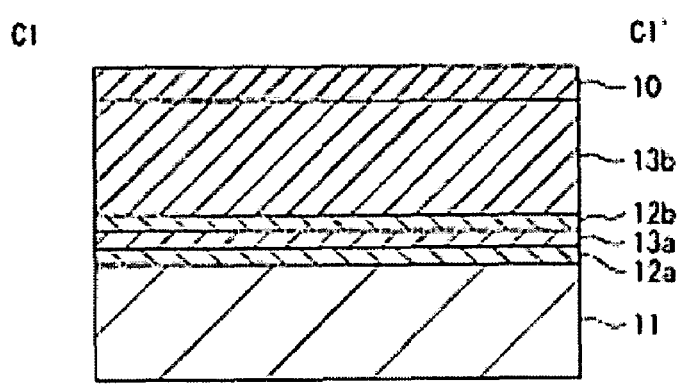
Figure 2:
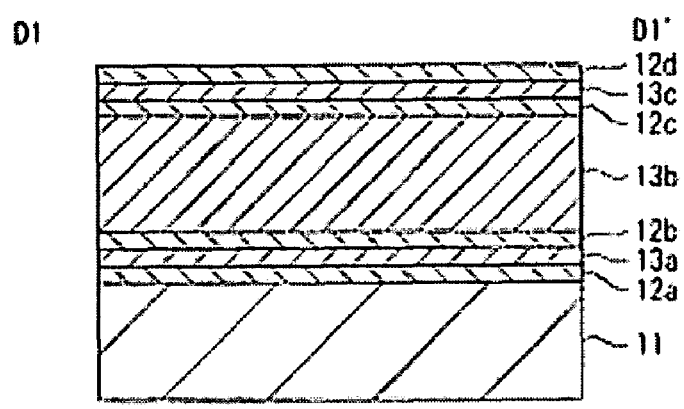
Figure 3:
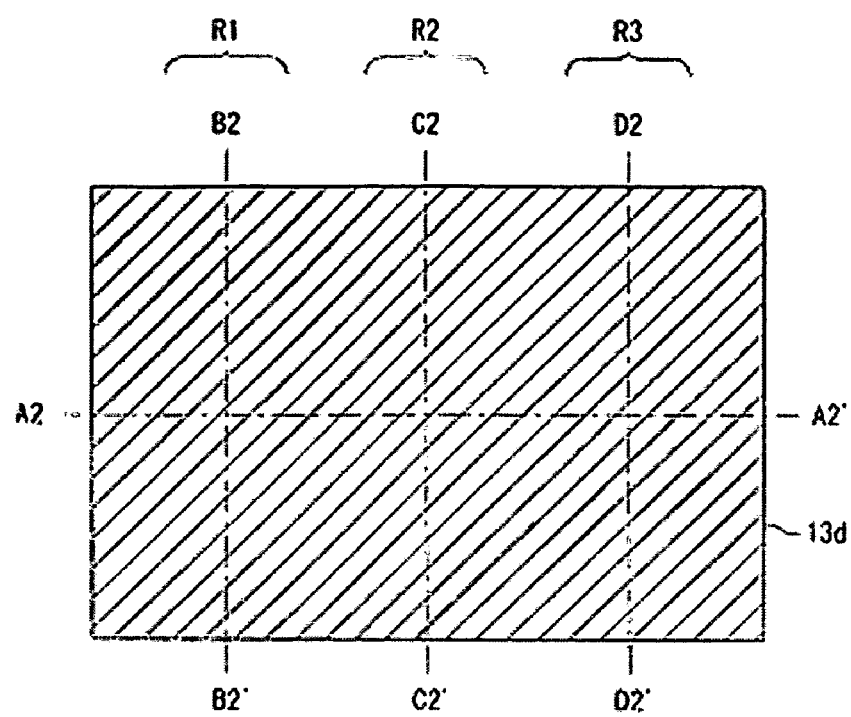
FIG. 3 is a plan view and a cross-sectional view showing the method for manufacturing the semiconductor device in accordance with an embodiment.
Figure 3:
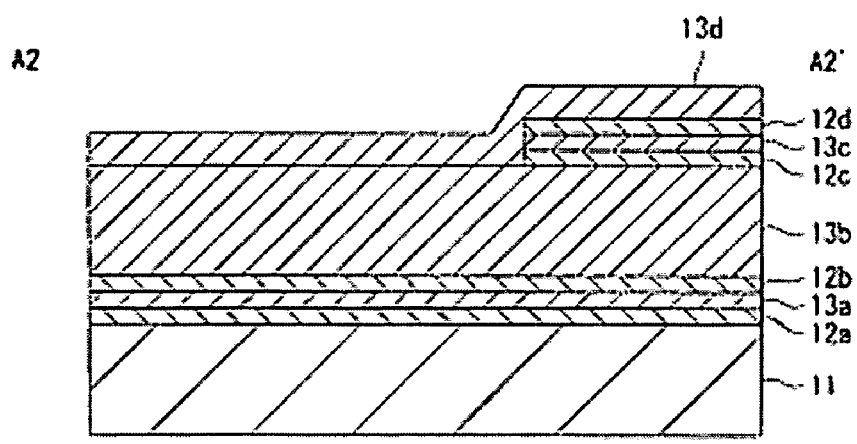
Figure 4:
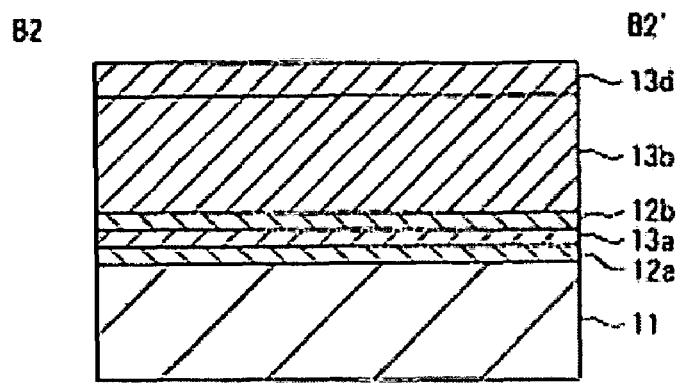
FIGS. 4(a)-4(c) are cross-sectional views showing the method for manufacturing the semiconductor device in accordance with an embodiment.
Figure 4:
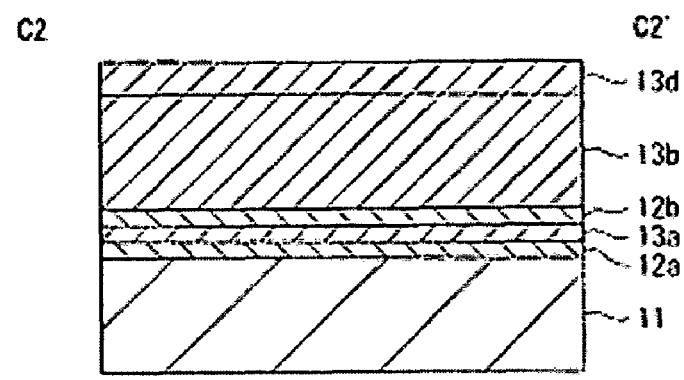
Figure 4:
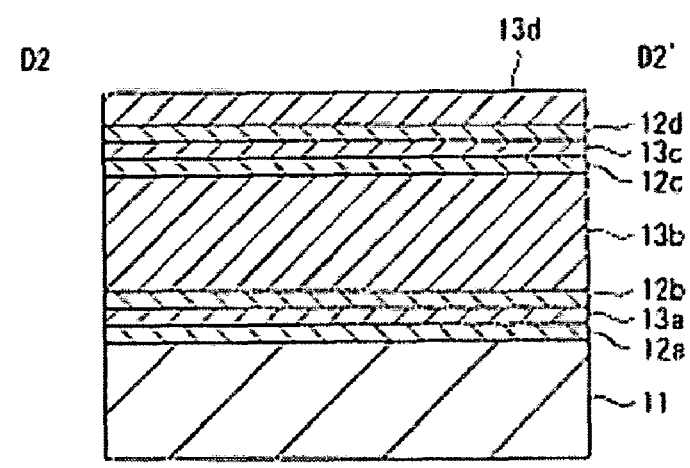
Figure 5:
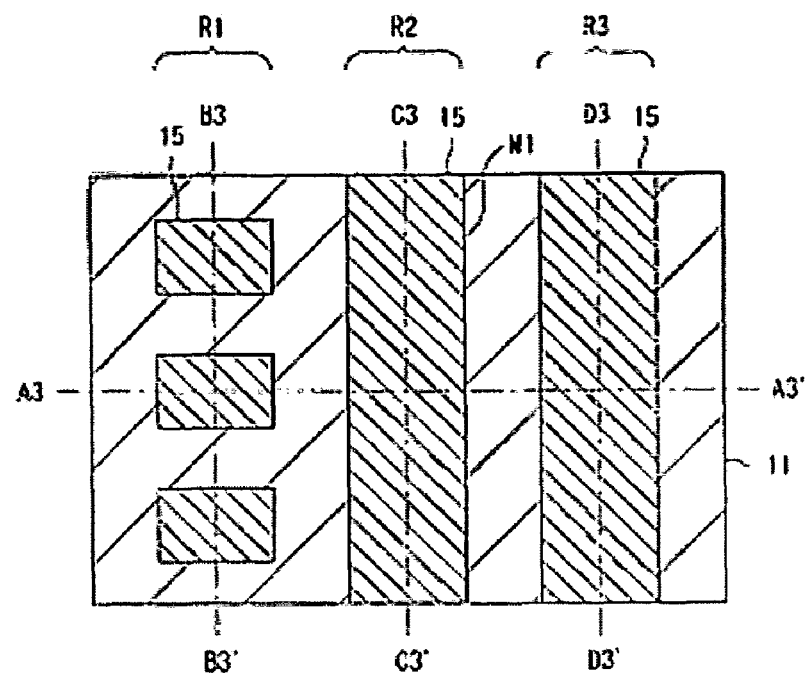
FIGS. 5(a)-5(b) are a plan view and a cross-sectional view showing the method for manufacturing the semiconductor device in accordance with an embodiment.
Figure 5:
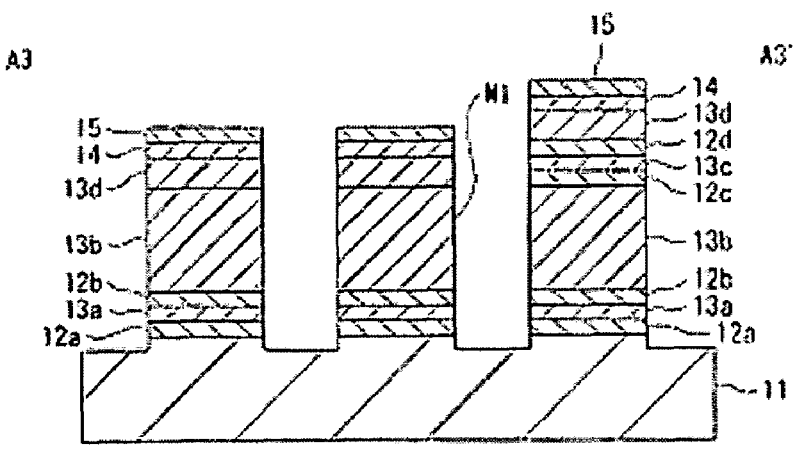
Figure 6:
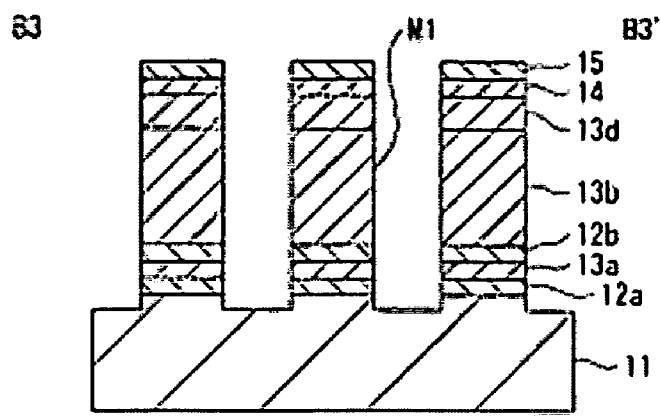
FIGS. 6(a)-6(c) are cross-sectional views showing the method for manufacturing the semiconductor device in accordance with an embodiment.
Figure 6:
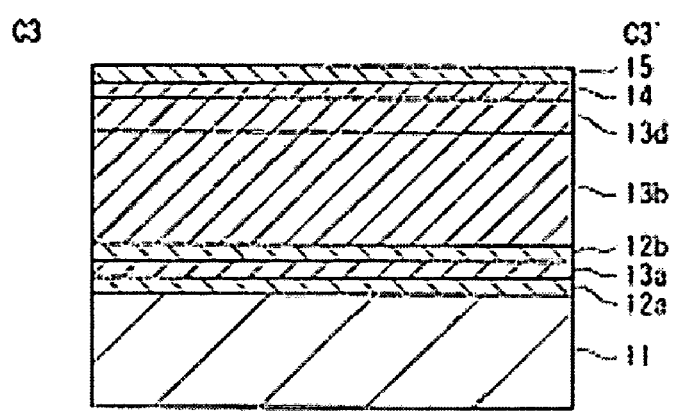
Figure 6:
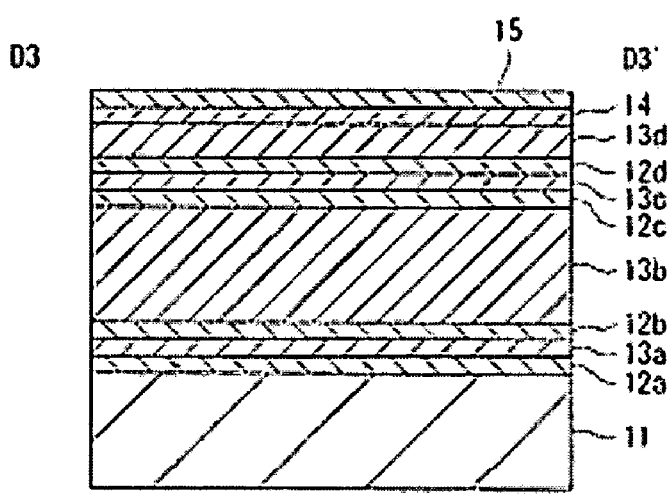
Figure 7:
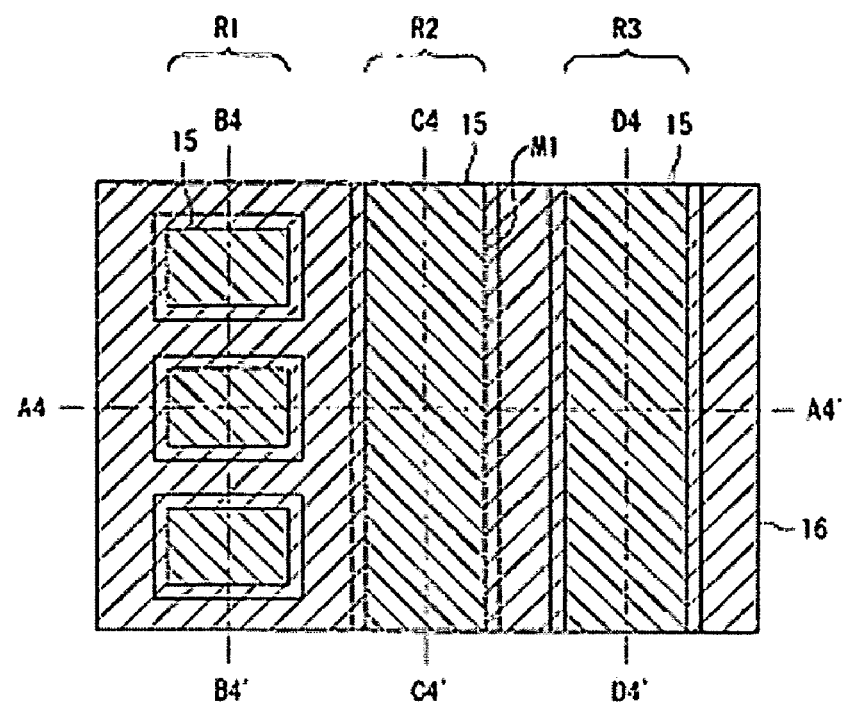
FIGS. 7(a)-7(b) are a plan view and a cross-sectional view showing the method for manufacturing the semiconductor device in accordance with an embodiment.
Figure 8:
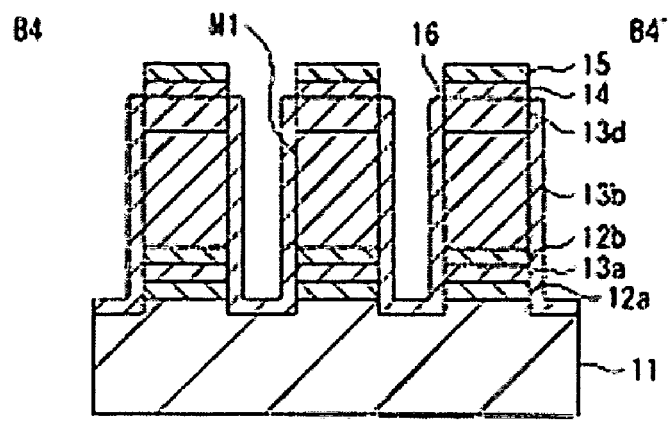
FIGS. 8(a)-8(c) are cross-sectional views showing the method for manufacturing the semiconductor device in accordance with an embodiment.
Figure 8:
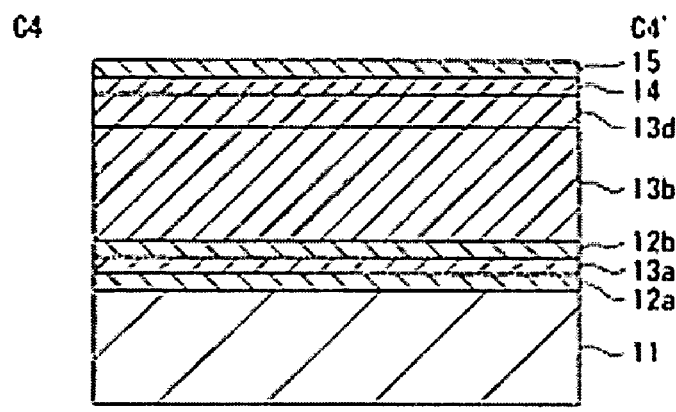
Figure 8:
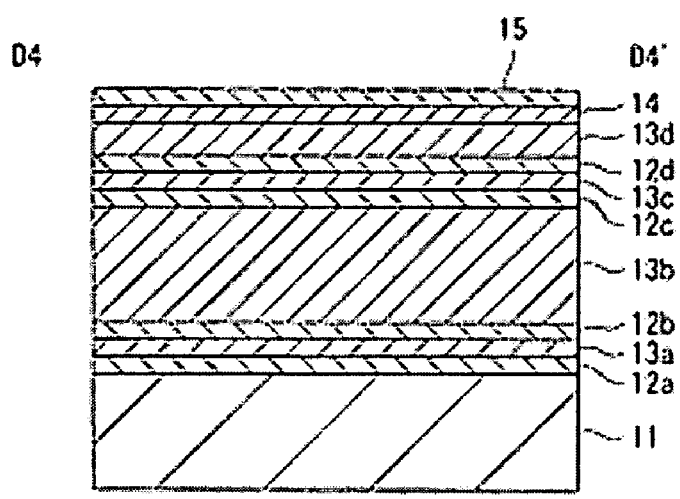
Figure 9:
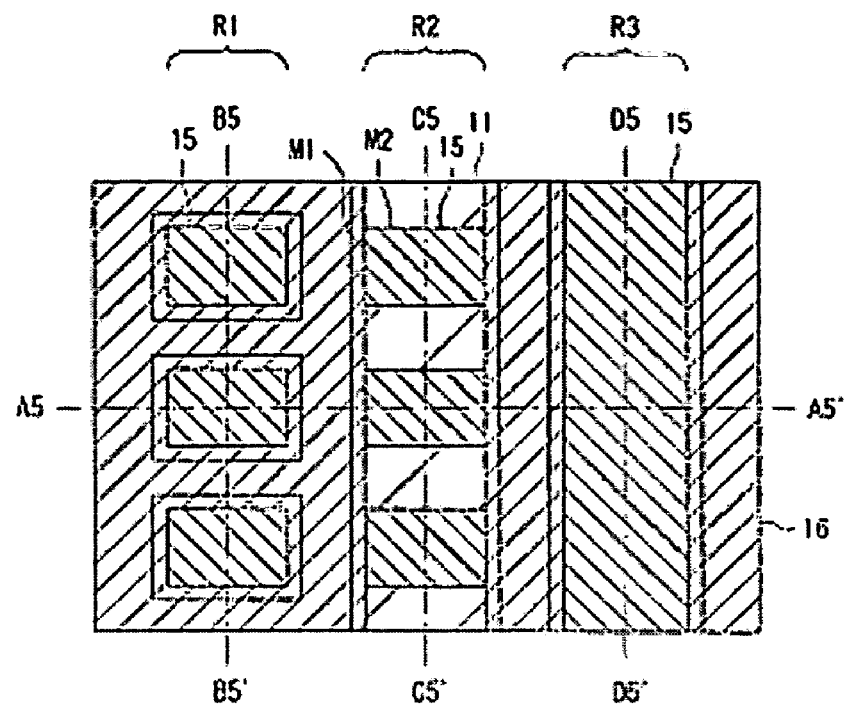
FIGS. 9(a)-9(b) are a plan view and a cross-sectional view showing the method for manufacturing the semiconductor device in accordance with an embodiment.
Figure 9:
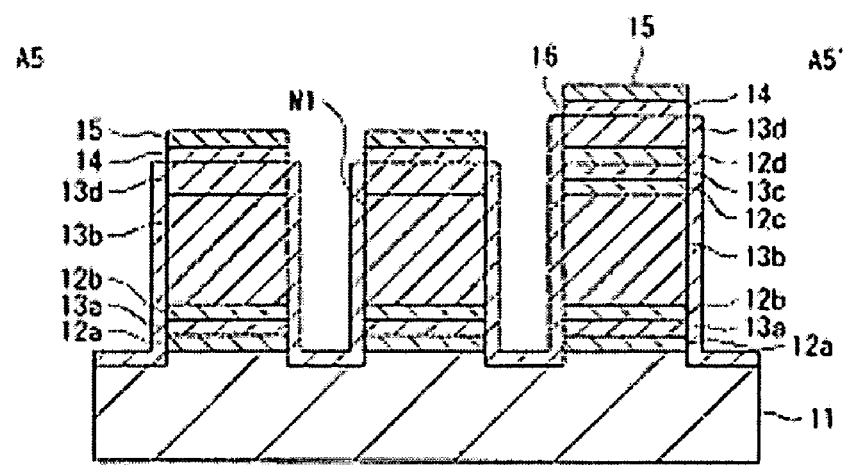
Figure 10:
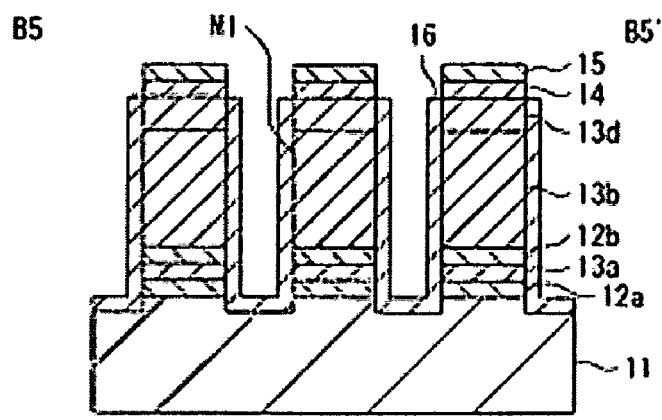
FIGS. 10(a)-10(c) are cross-sectional views showing the method for manufacturing the semiconductor device in accordance with an embodiment.
Figure 10:
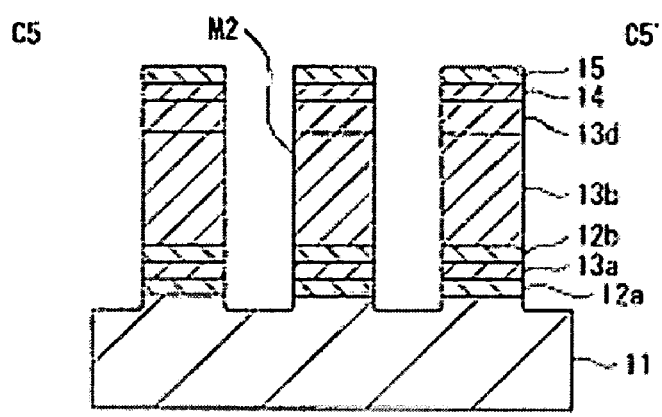
Figure 10:
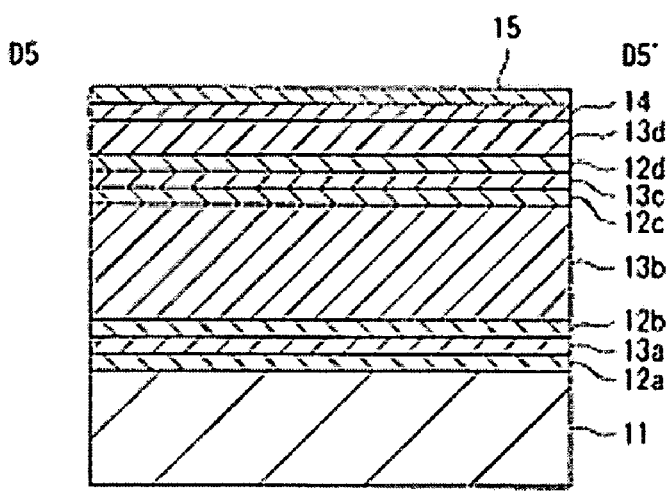
Figure 11:
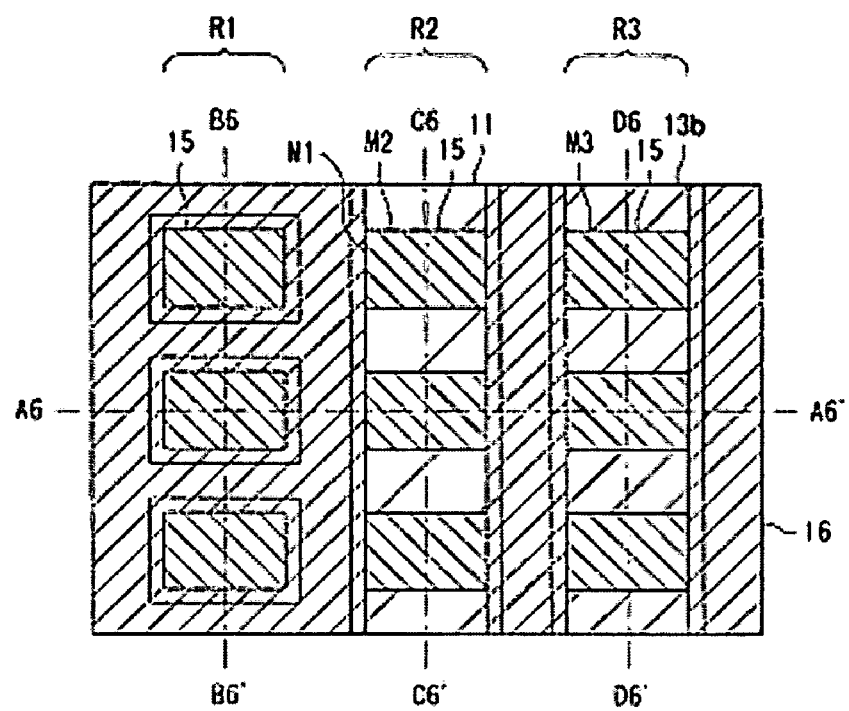
FIGS. 11(a)-11(b) are a plan view and a cross-sectional view showing the method for manufacturing the semiconductor device in accordance with an embodiment.
Figure 11:
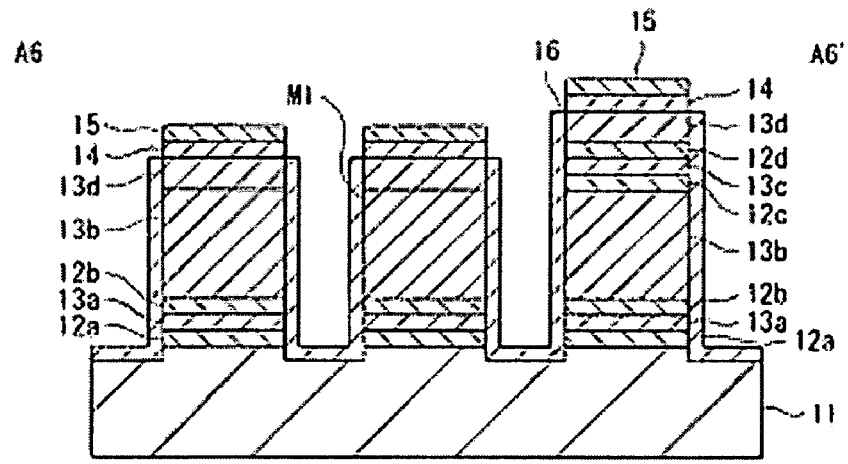
Figure 12:
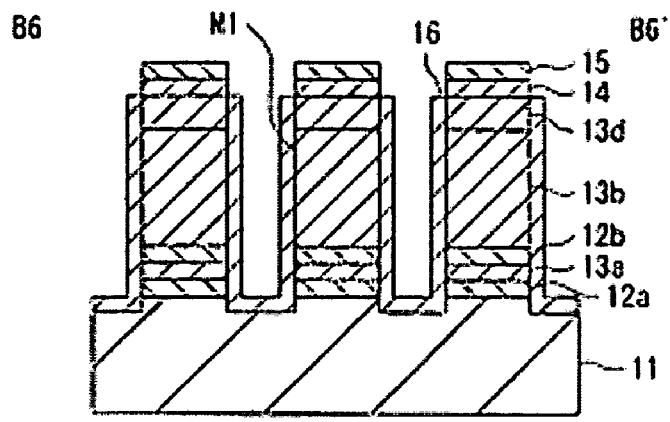
FIGS. 12(a)-12(c) are cross-sectional views showing the method for manufacturing the semiconductor device in accordance with an embodiment.
Figure 12:
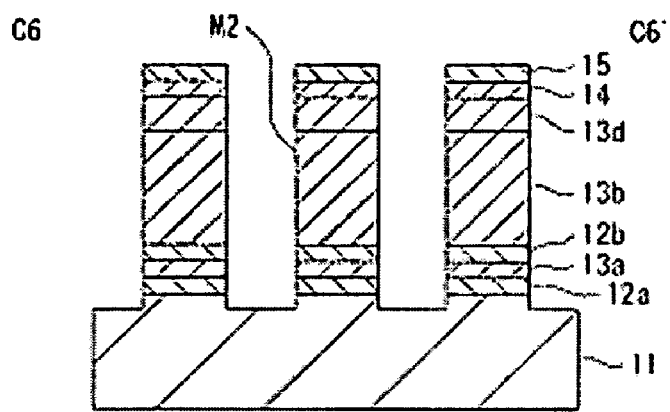
Figure 12:
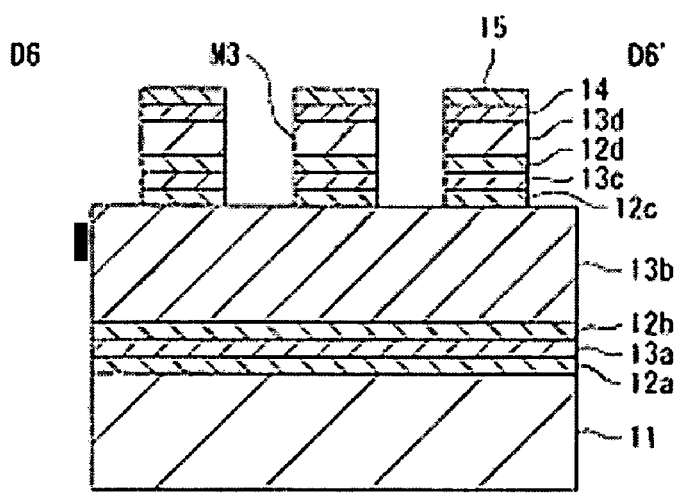
Figure 13:
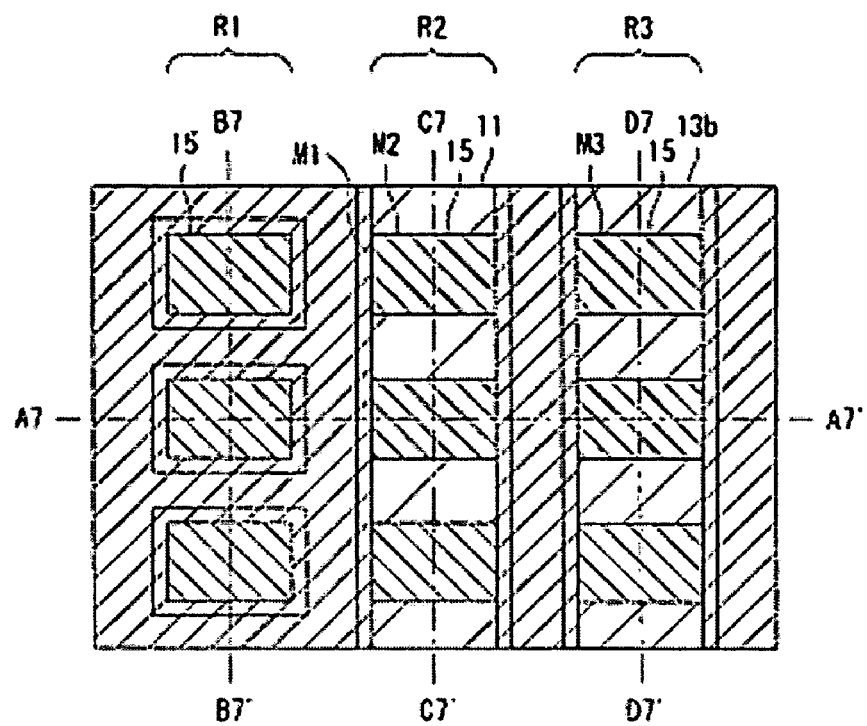
FIGS. 13(a)-13(b) are a plan view and a cross-sectional view showing the method for manufacturing the semiconductor device in accordance with an embodiment.
Figure 13:
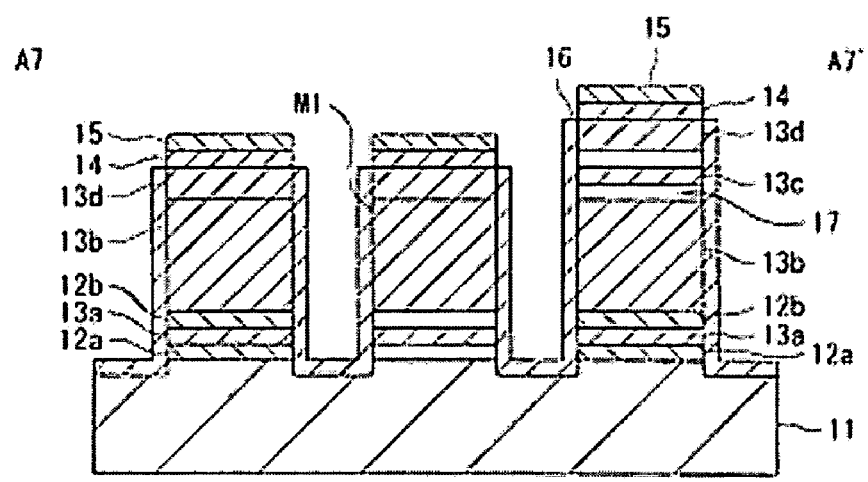
Figure 14:
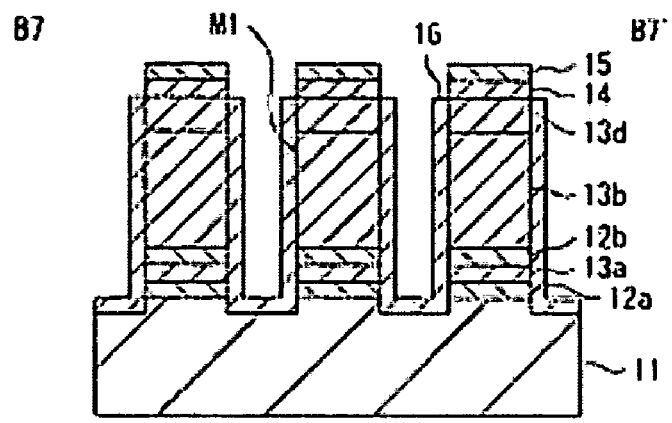
FIGS. 14(a)-14(c) are cross-sectional views showing the method for manufacturing the semiconductor device in accordance with an embodiment.
Figure 14:
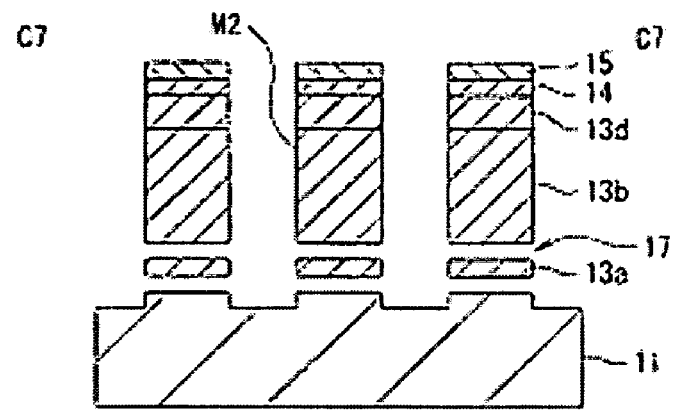
Figure 14:
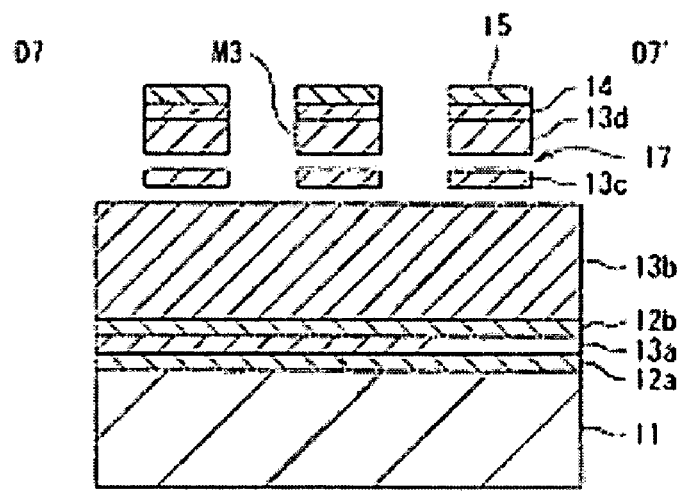
Figure 15:
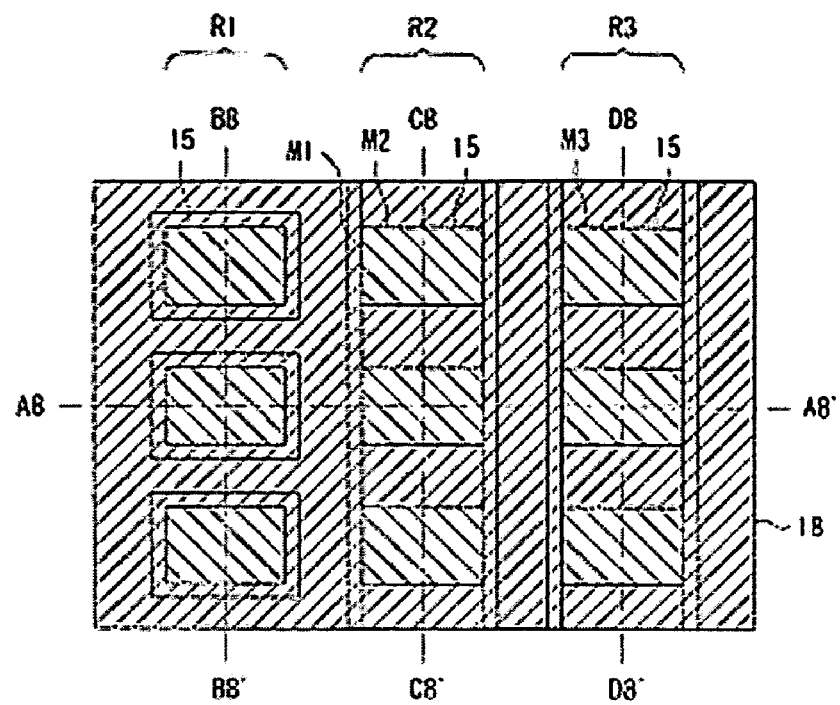
FIGS. 15(a)-15(b) are a plan view and a cross-sectional view showing the method for manufacturing the semiconductor device in accordance with an embodiment.
Figure 15:
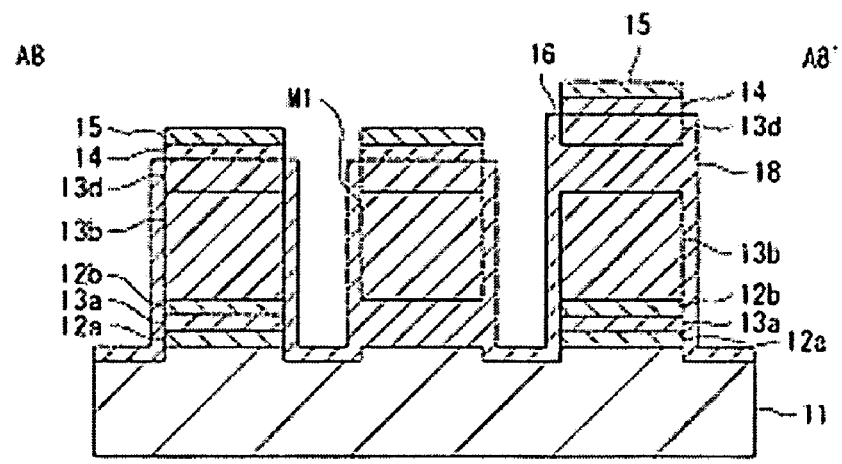
Figure 16:
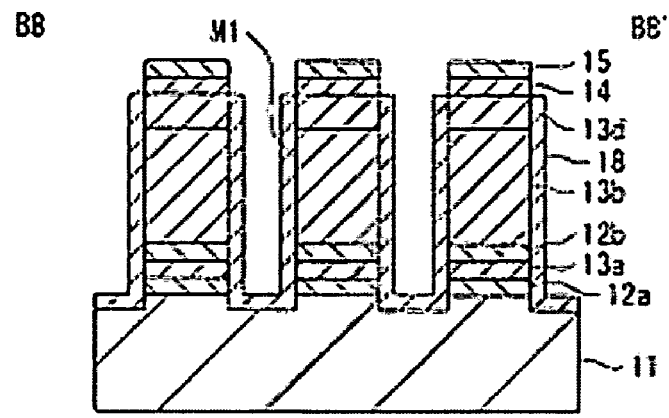
FIGS. 16(a)-16(c) are cross-sectional views showing the method for manufacturing the semiconductor device in accordance with an embodiment.
Figure 16:
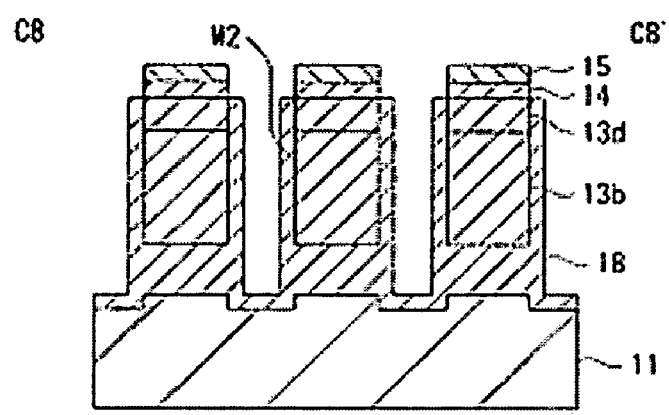
Figure 16:
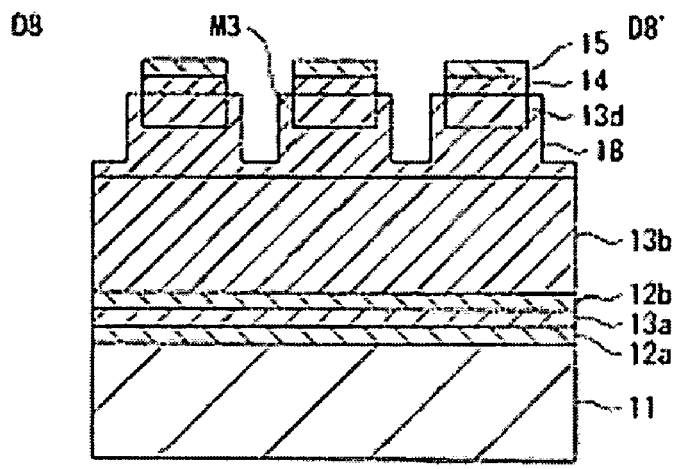
Figure 17:
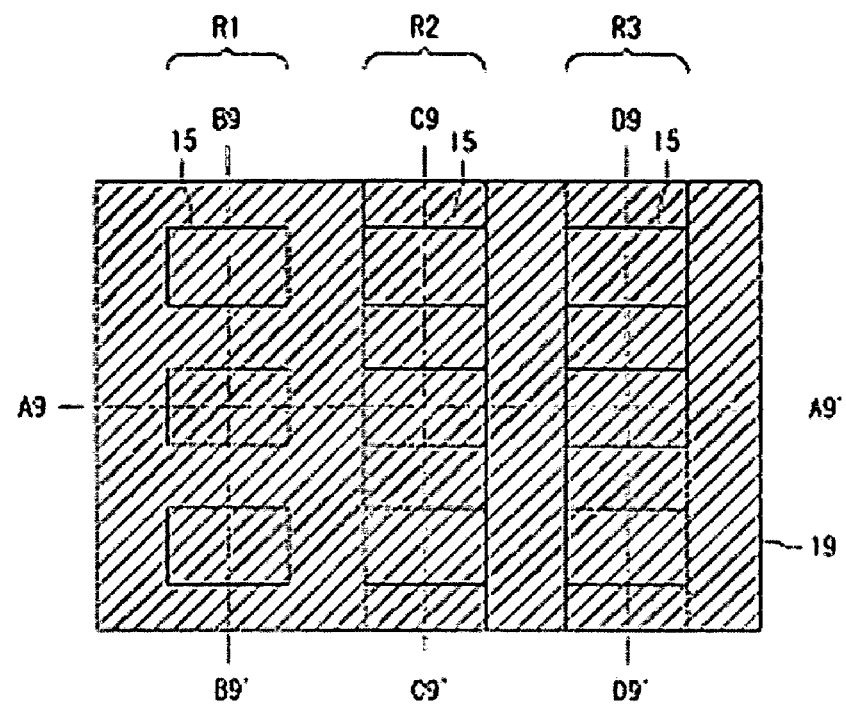
FIGS. 17(a)-17(b) are a plan view and a cross-sectional view showing the method for manufacturing the semiconductor device in accordance with an embodiment.
Figure 17:
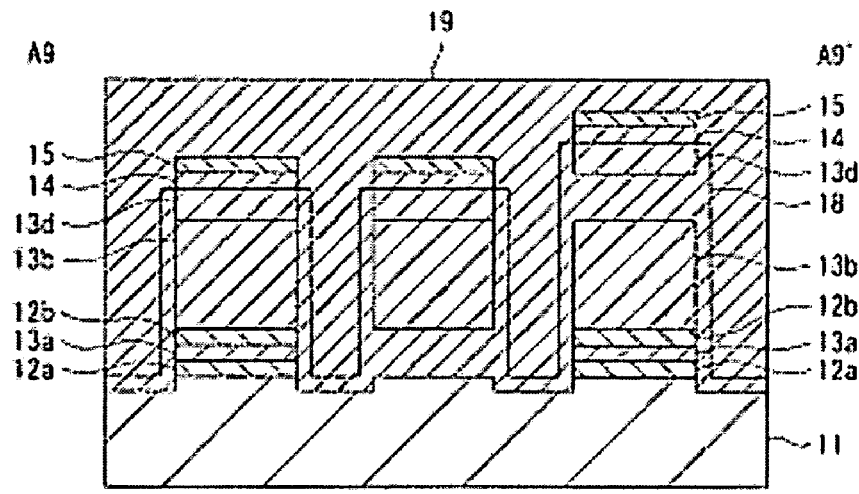
Figure 18:
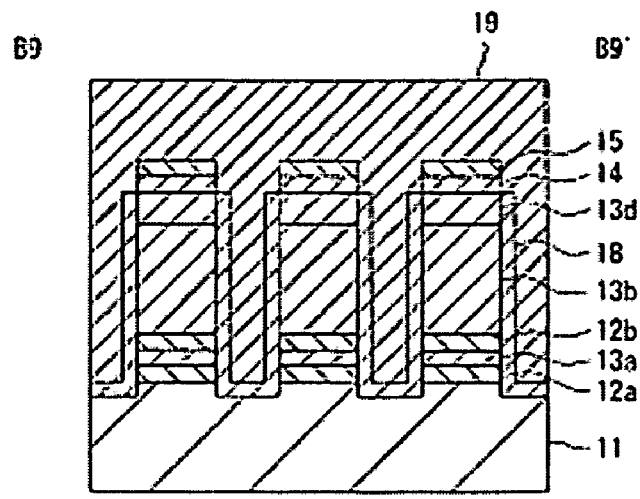
FIGS. 18(a)-18(c) are cross-sectional views showing the method for manufacturing the semiconductor device in accordance with an embodiment.
Figure 18:
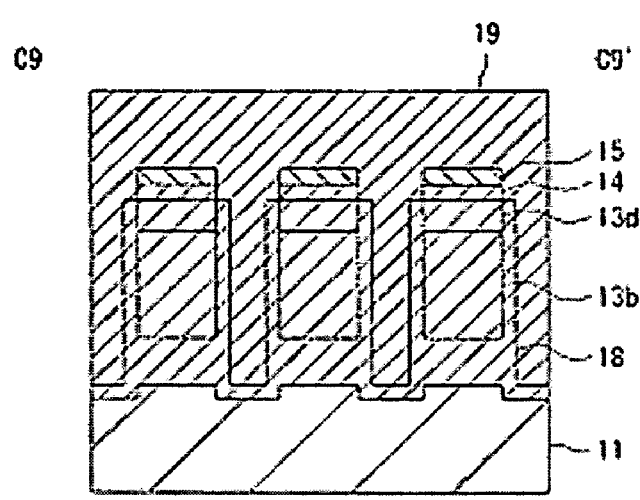
Figure 18:
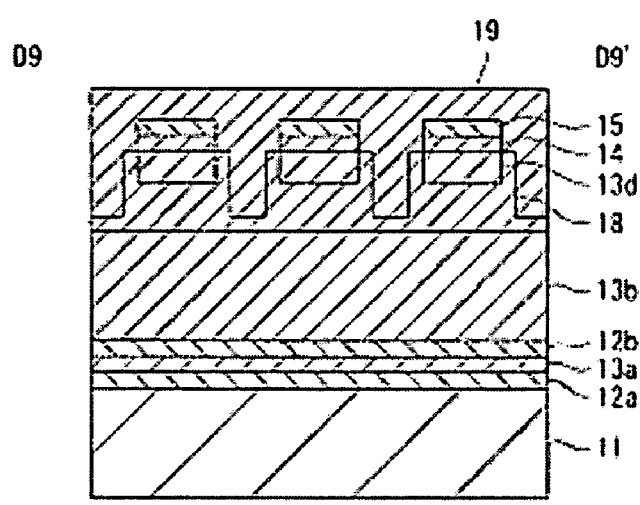
Figure 19:
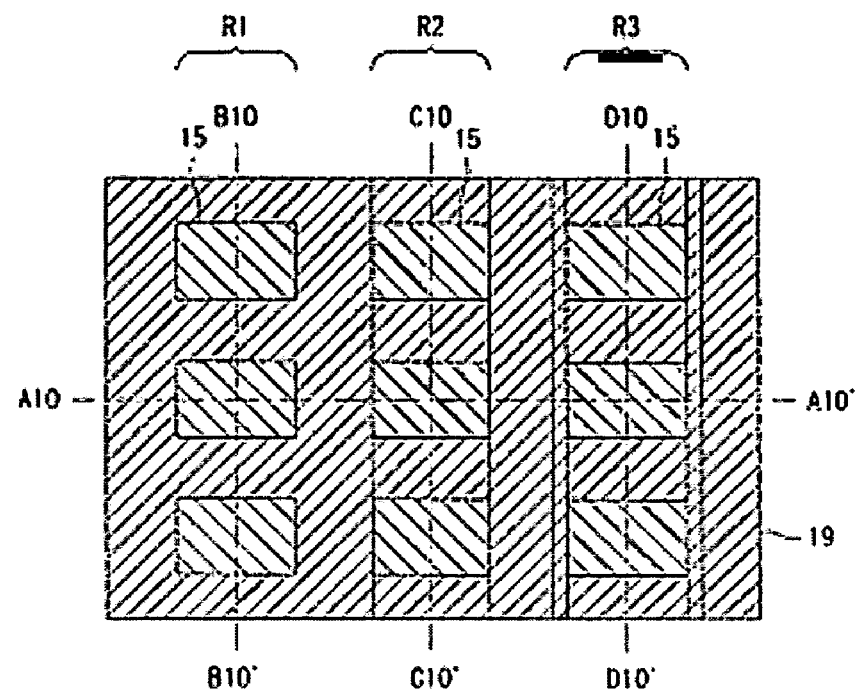
FIGS. 19(a)-19(b) are a plan view and a cross-sectional view showing the method for manufacturing the semiconductor device in accordance with an embodiment.
Figure 19:
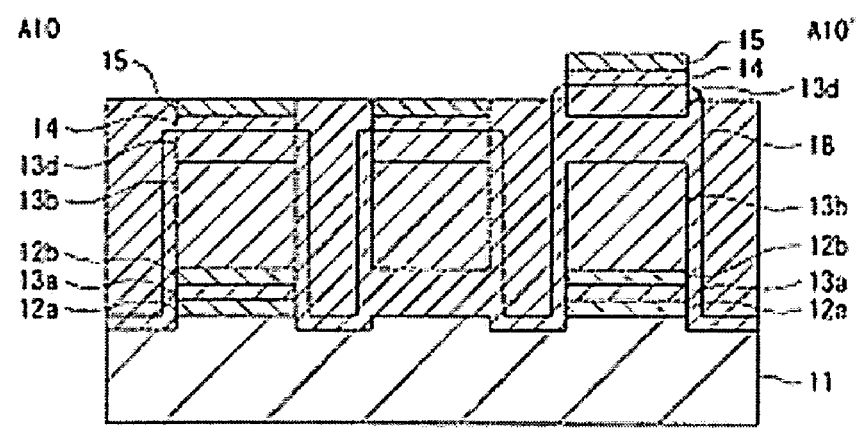
Figure 20:
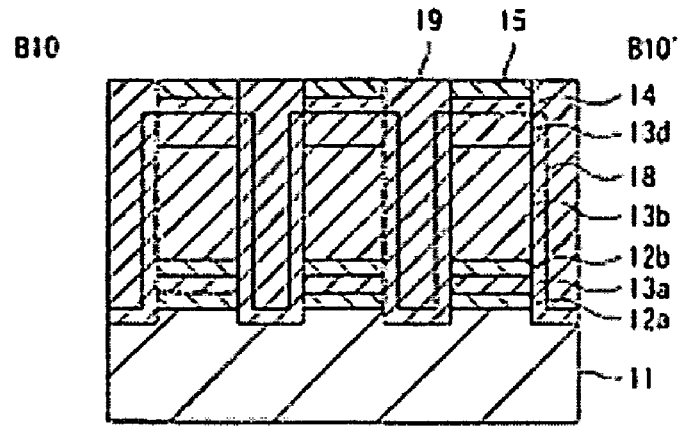
FIGS. 20(a)-20(c) are cross-sectional views showing the method for manufacturing the semiconductor device in accordance with an embodiment.
Figure 20:
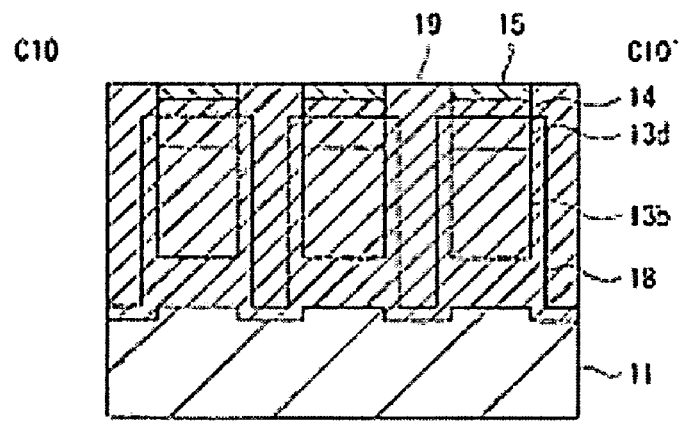
Figure 20:
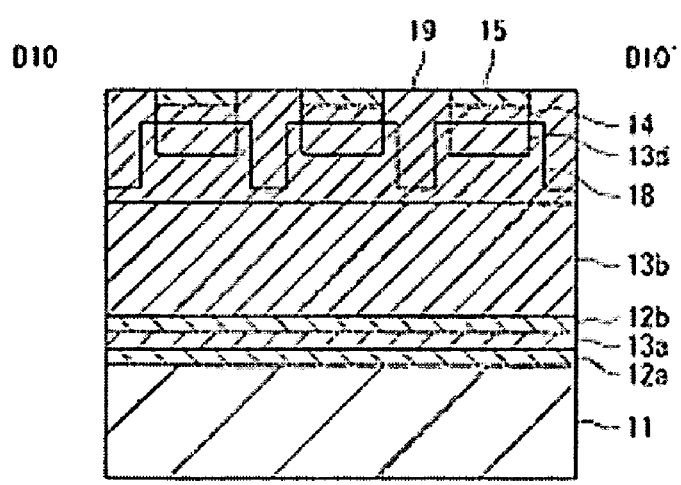
Figure 21:
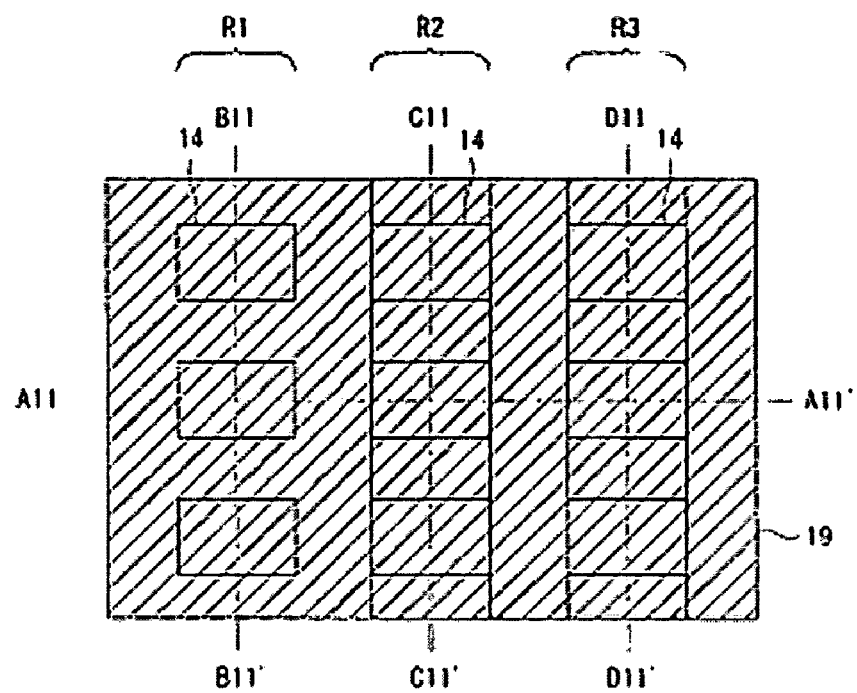
FIGS. 21(a)-21(b) are a plan view and a cross-sectional view showing the method for manufacturing the semiconductor device in accordance with an embodiment.
Figure 21:
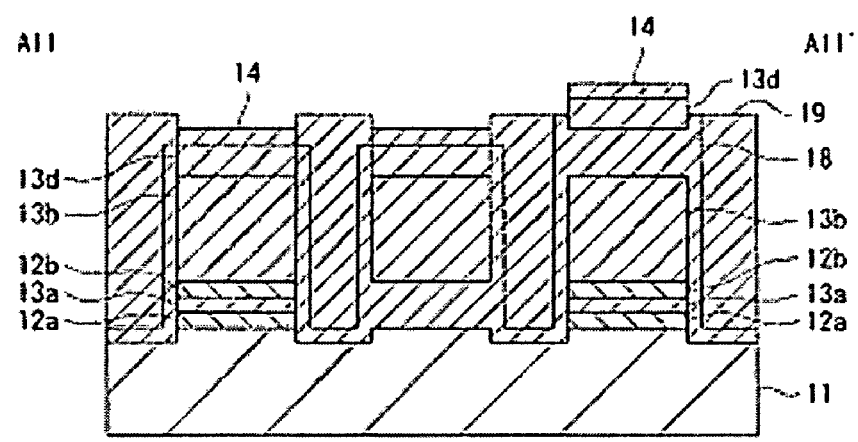
Figure 22:
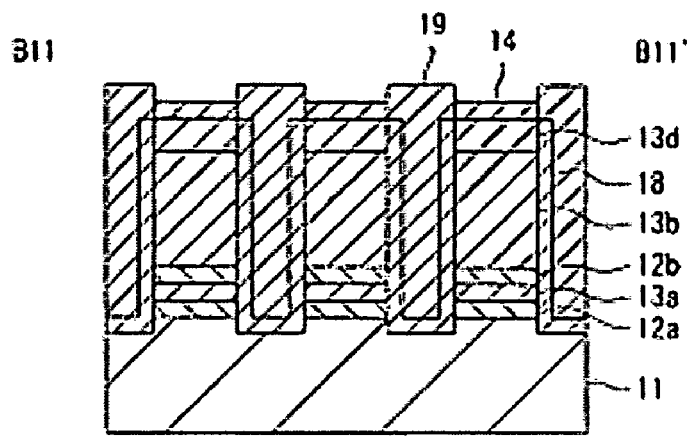
FIGS. 22(a)-22(c) are cross-sectional views showing the method for manufacturing the semiconductor device in accordance with an embodiment.
Figure 22:
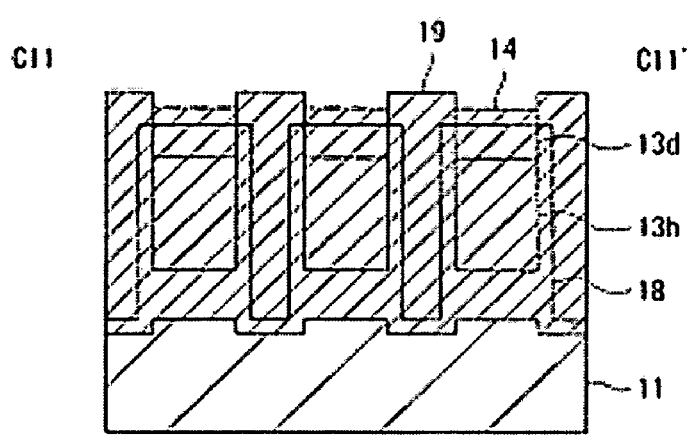
Figure 22:
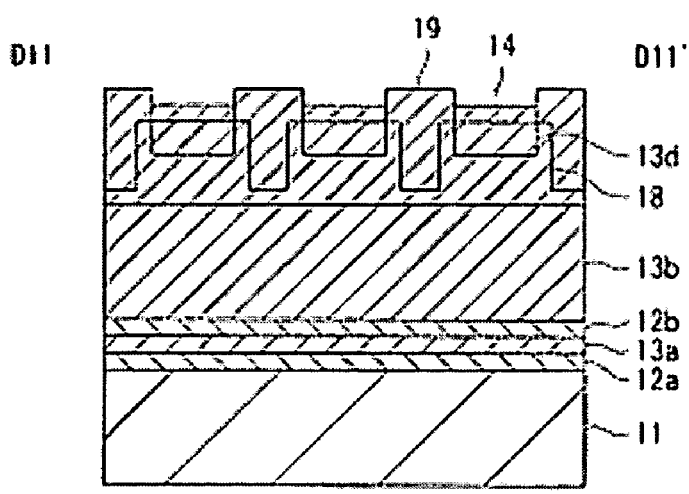
Figure 23:
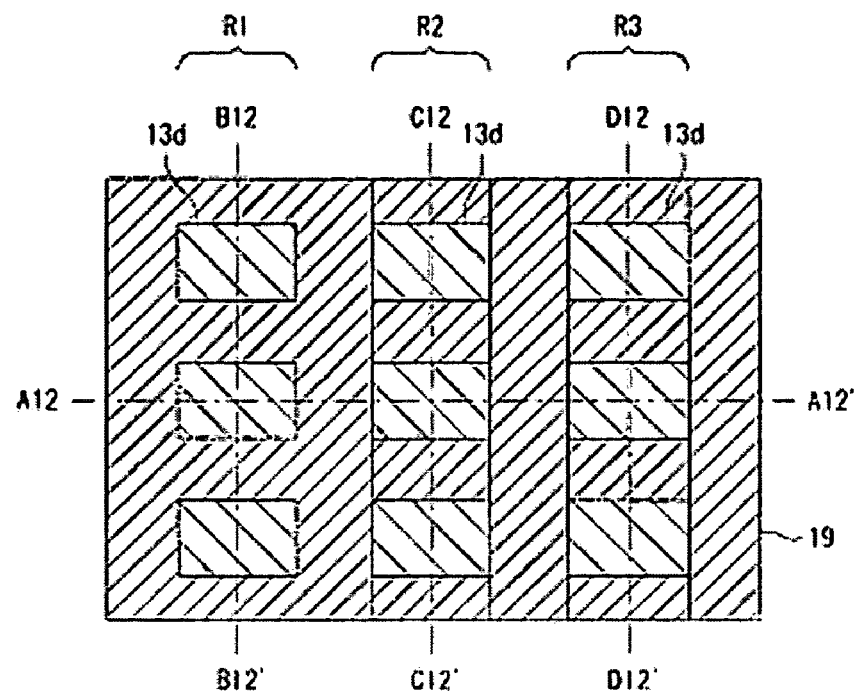
FIGS. 23(a)-23(b) are a plan view and a cross-sectional view showing the method for manufacturing the semiconductor device in accordance with an embodiment.
Figure 23:
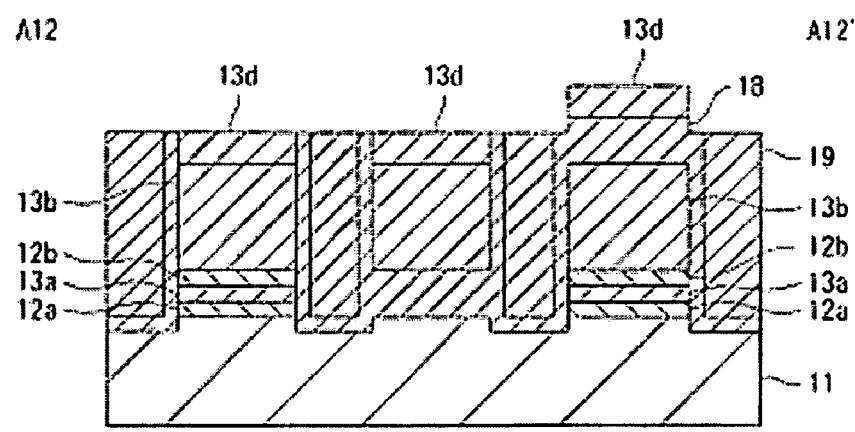
Figure 24:
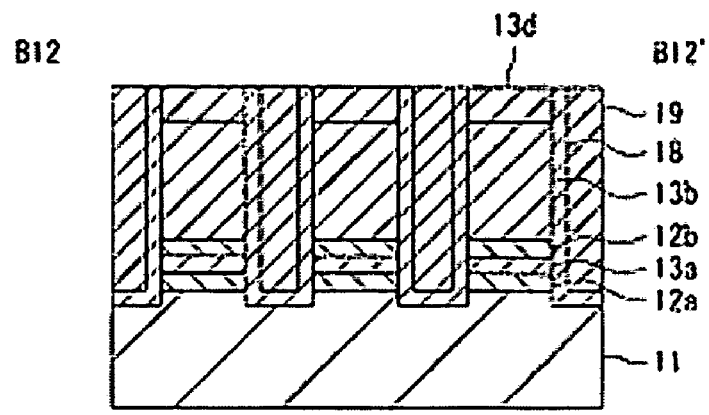
FIGS. 24(a)-24(c) are cross-sectional views showing the method for manufacturing the semiconductor device in accordance with an embodiment.
Figure 24:
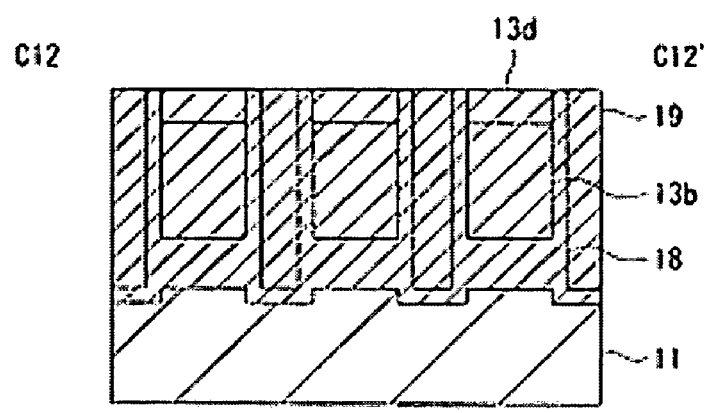
Figure 24:
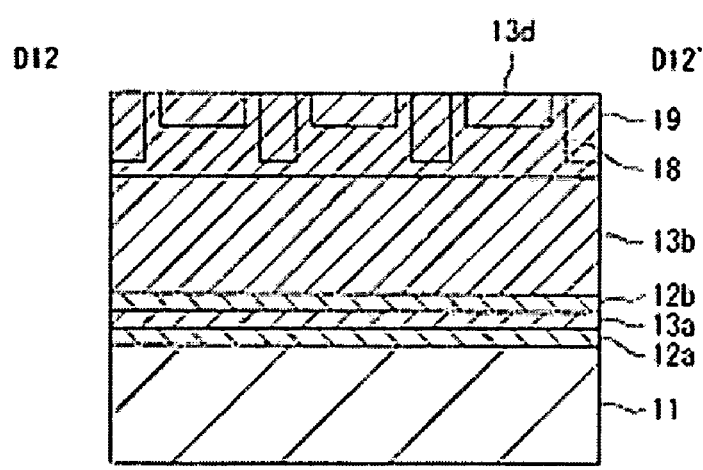
Figure 25:
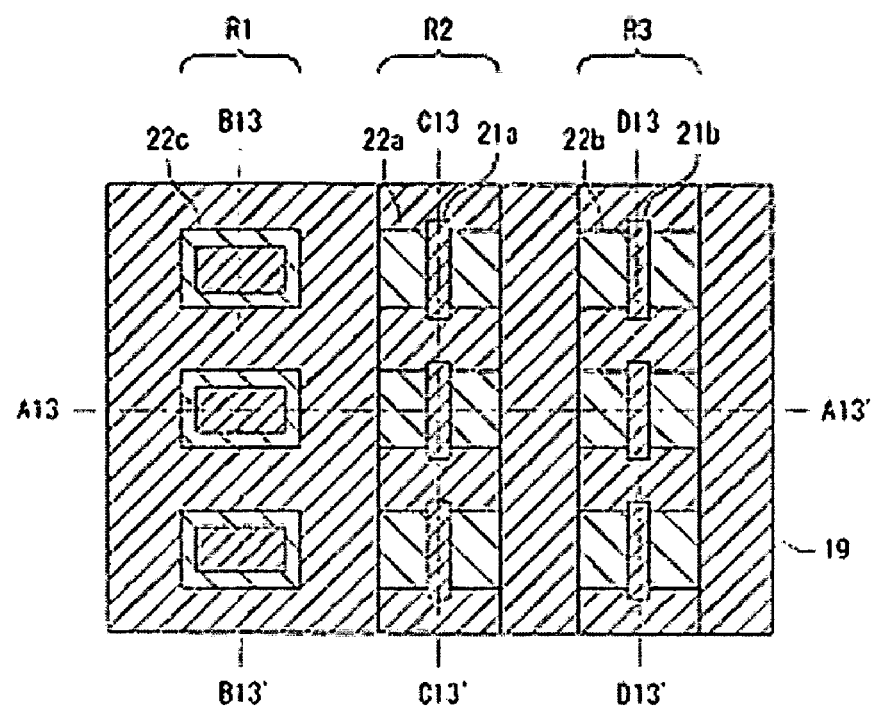
FIGS. 25(a)-25(b) are a plan view and a cross-sectional view showing the method for manufacturing the semiconductor device in accordance with an embodiment.
Figure 25:
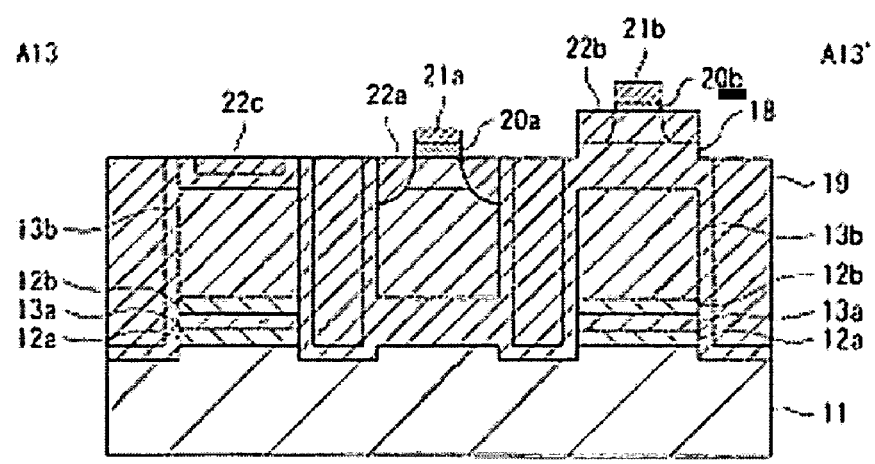
Figure 26:
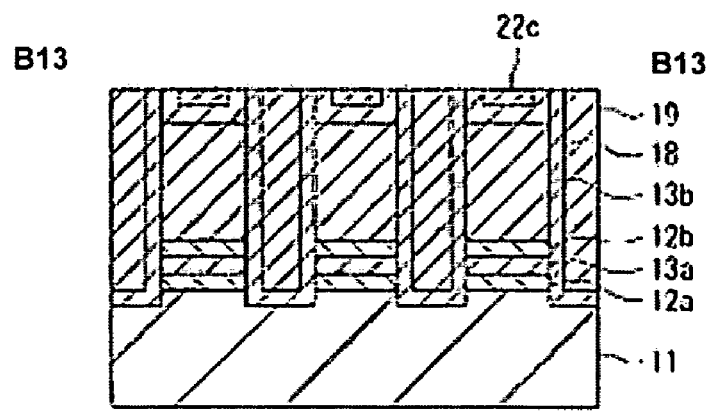
FIGS. 26(a)-26(c) are cross-sectional views showing the method for manufacturing the semiconductor device in accordance with an embodiment.
Figure 26:
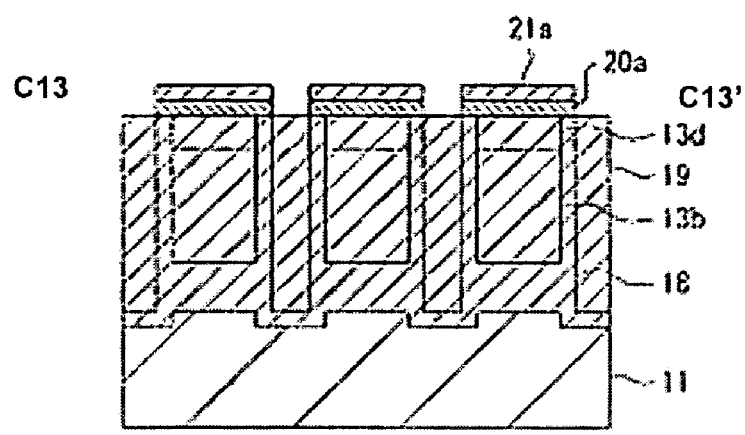
Figure 26:
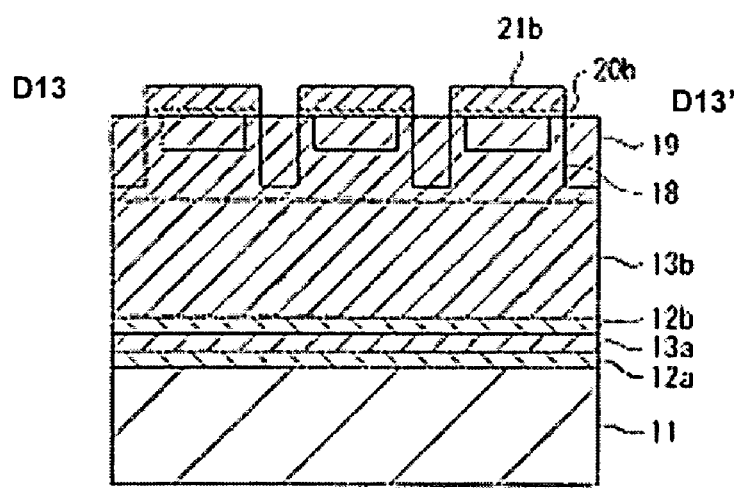

FIGS. 1-FIGS. 26 are plan views and cross-sectional views showing a method for manufacturing a semiconductor device in accordance with an embodiment of the present invention.

Referring to FIGS. 1(a)-1(b) and FIGS. 2(a)-2(c), first single crystal semiconductor layers 12a and 12b and second single crystal semiconductor layers 13a and 13b are alternately laminated on a semiconductor substrate 11 by epitaxial growth. It is noted that, for example, Si, Ge, SiGe, GaAs, InP, GaP, GaN, SiC and the like can be used as materials for the semiconductor substrate 11, the first single crystal semiconductor layers 12a and 12b, and the second single crystal semiconductor layers 13a and 13b.

It is noted here that the first single crystal semiconductor layers 12a and 12b can use materials having a selection ratio at etching greater than that of the semiconductor substrate 11 and the second single crystal semiconductor layers 13a and 13b. In particular, when the semiconductor substrate 11 consists of Si, SiGe may preferably be used as the first single crystal semiconductor layers 12a and 12b, and Si for the second single crystal semiconductor layers 12a and 13b. By this, lattice matching can be achieved among the first single crystal semiconductor layers 12a and 12b and the second single crystal semiconductor layers 13a and 13b, and selection ratios can be secured among the first single crystal semiconductor layers 12a and 12b and the second single crystal semiconductor layers 13a and 13b.

It is noted that a non-BOX layer region R1, a thick film semiconductor region R2 and a thin film semiconductor region R3 can be provided in the semiconductor substrate 11. Then, a protection diode or a bipolar transistor may be formed in the non-BOX layer region R1, a partially depleted type field effect transistor may be formed in the thick film semiconductor region R2, and a completely depleted type field effect transistor can be formed in the thin film semiconductor region R3.

Then, an oxide film 10 is deposited on the entire surface of the second single crystal semiconductor layer 13b. Then, by using a photolithography technique and an etching technique, the oxide film 10 is patterned to thereby remove the oxide film 10 in the thin film semiconductor region R3, and expose the second single crystal semiconductor layer 13b in the thin film semiconductor region R3.

Then, by conducting epitaxial growth by using the oxide film 10 as a mask, a first single crystal semiconductor layer 12c, a second single crystal semiconductor layer 13c and a first single crystal semiconductor layer 12d are selectively formed on the second single crystal semiconductor layer 13b in the thin film semiconductor region R3.

Next, as shown in FIG. 3 and FIGS. 4(a)-4(c), the oxide film 10 on the second single crystal semiconductor layer 13b is removed, and then epitaxial growth is conducted on the second single crystal semiconductor layer 13b and the first single crystal semiconductor layer 12d, thereby forming a second single crystal semiconductor layer 13d and a second single crystal semiconductor layer 13b on the first single crystal semiconductor layer 12d.

It is noted that, for example, Si, Ge, SiGe, GaAs, InP, GaP, GaN, SiC and the like can be used as materials for the first single crystal semiconductor layers 12c and 12d, and the second single crystal semiconductor layers 13c and 13d. It is noted here that the first single crystal semiconductor layers 12c and 12d can use materials having a selection ratio at the time of etching greater than that of the second single crystal semiconductor layers 13c and 13d. In particular, when the second single crystal semiconductor layers 13c and 13d consists of Si, SiGe may preferably be used as the first single crystal semiconductor layers 12c and 12d.

Also, in the embodiment described above, a method that uses epitaxial growth using the oxide film 10 as a mask is described for forming the first single crystal semiconductor layer 12c, the second single crystal semiconductor layer 13c and the first single crystal semiconductor layer 12d on the second single crystal semiconductor layer 13b in the thin film semiconductor region R3. However, the first single crystal semiconductor layer 12c, the second single crystal semiconductor layer 13c and the first single crystal semiconductor layer 12d may be formed on the entire surface of the second single crystal semiconductor layer 13b, and then the first single crystal semiconductor layer 12c, the second single crystal semiconductor layer 13c and the first single crystal semiconductor layer 12d in the non-BOX layer region R1 and the thick film semiconductor region R2 may be selectively removed.

Next, as shown in FIGS. 5(a)-5(b) and FIGS. 6(a)-6(c), the second single crystal semiconductor layer 13d is thermally oxidized to thereby form a sacrificial oxide film 14 on a surface of the second single crystal semiconductor layer 13d. Then, an oxidation prevention film 15 is formed on the entire surface of the sacrificial oxide film 14 by a CVD method or the like. It is noted that, for example, a silicon nitride film can be used as the oxidation prevention film 15. Then, by using a photolithography technique and an etching technique, the oxidation prevention film 15, the sacrificial oxide film 14, the first single crystal semiconductor layers 12a-12d and the second single crystal semiconductor layers 13a-13d are patterned, to thereby form grooves M1 in a predetermined direction that expose the semiconductor substrate 11.

It is noted that, when the semiconductor substrate 11 is exposed, etching may be stopped at the surface of the semiconductor substrate 11, or recessed portions may be formed in the semiconductor substrate 11 by over-etching the semiconductor substrate 11. Also, arrangement positions of the grooves M1 may be made to correspond to a part of element isolation regions that isolate the non-BOX layer region R1, the thick film semiconductor region R2 and the thin film semiconductor region R3 from one another. Also, the grooves M1 may be arranged such that the non-BOX layer region R1, the thick film semiconductor region R2 and the thin film semiconductor region R3 are mutually isolated, and the non-BOX layer region R1 may be further divided into smaller areas.

Figure 7B:
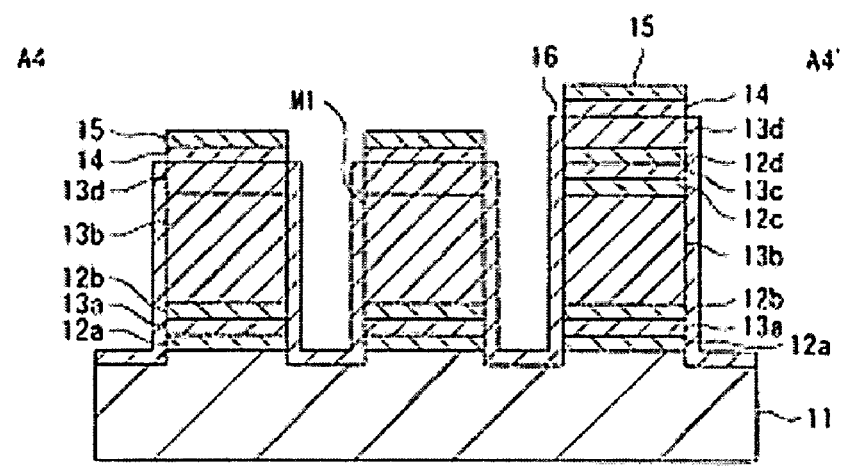

Next, as shown in FIGS. 7(a)-7(b) and FIGS. 8(a)-8(c), supporting bodies 16, each being formed on side walls of the first single crystal semiconductor layers 12a-12d and the second single crystal semiconductor layers 13a-13d, and supports the second single crystal semiconductor layers 13a-13d on the semiconductor substrate 11, are formed in the grooves M1. It is noted that, when forming the supporting body 16 in a film on the side walls of the first single crystal semiconductor layers 12a-12d and the second single crystal semiconductor layers 13a-13d, epitaxial growth of semiconductor can be used. It is noted here that, by using the epitaxial growth of semiconductor, the supporting body 16 can be selectively formed on the side surfaces of the first single crystal semiconductor layers 12a-12d and the second single crystal semiconductor layers 13a-13d and the surface of the semiconductor substrate 11. It is noted that, for example, Si, Ge, SiGe, SiC, SiSn, PbS, GaAs, InP, GaP, GaN, ZnSe or the like can be used as a material for the supporting body 16. In particular, when the semiconductor substrate 11 and the second single crystal semiconductor layers 13a-13d consist of Si, and the first single crystal semiconductor layers 12a-12d consist of SiGe, Si may preferably be used as a material of the supporting body 16.

By this, lattice matching can be achieved among the supporting body 16 and the first single crystal semiconductor layers 12a-12d, and selection ratios can be secured among the supporting body 16 and the first single crystal semiconductor layers 12a-12d. Also, by using semiconductor such as Si as a material of the supporting body 16, the three-dimensional cubic structure by the semiconductor can be maintained, even when the first single crystal semiconductor layers 12a-12d are removed. For this reason, the chemical resistance property and mechanical stress resistance property can be improved, such that a stable element isolation process with good reproducibility can be realized. It is noted that, besides semiconductors, a dielectric such as a silicon oxide film may be used as the material of the supporting body 16.

Next, as shown in FIGS. 9(a)-9(b) and FIGS. 10(a)-10(c), the oxidation prevention film 15, the sacrificial oxide film 14, the first single crystal semiconductor layers 12a and 12b and the second single crystal semiconductor layers 13a, 13b and 13d are patterned by using a photolithography technique and an etching technique, whereby grooves M2 that expose the semiconductor substrate 11 are formed along a direction orthogonal to the grooves M1 in the thick film semiconductor region R2. It is noted that, when the semiconductor substrate 11 is exposed, etching may be stopped at the surface of the semiconductor substrate 11, or recessed sections may be formed in the semiconductor substrate 11 by over-etching the semiconductor substrate 11. Also, arrangement positions of the grooves M2 may be made to correspond to the element isolation regions of the single crystal semiconductor layer 13d.

Next, as shown in FIGS. 11(a)-11(b) and FIGS. 12(a)-12(c), the oxidation prevention film 15, the sacrificial oxide film 14, the first single crystal semiconductor layers 12c and 12d and the second single crystal semiconductor layers 13c and 13d are patterned by using a photolithography technique and an etching technique, whereby grooves M3 that expose the second single crystal semiconductor layer 13b are formed along a direction orthogonal to the grooves M1 are formed in the thin film semiconductor region R3. It is noted that, when the second single crystal semiconductor layer 13b is exposed, etching may be stopped at the surface of the second single crystal semiconductor layer 13b, or recessed sections may be formed in the second single crystal semiconductor layer 13b by over-etching the second single crystal semiconductor layer 13b. Also, arrangement positions of the grooves M3 may be made to correspond to the element isolation regions of the single crystal semiconductor layer 13d.

Also, instead of exposing the surface of the second single crystal semiconductor layer 13b, etching may be stopped at the surface of the first single crystal semiconductor layer 12c, or the first single crystal semiconductor layer 12c may be over-etched, thereby etching halfway through the first single crystal semiconductor layer 12c. It is noted that, by stopping the etching halfway through the first single crystal semiconductor layer 12c, the surface of the second single crystal semiconductor layer 13b within the grooves M3 is prevented from being exposed. For this reason, when the first single crystal semiconductor layers 12c and 12d are etched and removed, the time during which the second single crystal semiconductor layer 13b within the grooves M3 is exposed to etching liquid or etching gas can be reduced, such that over-etching of the second single crystal semiconductor layer 13b within the grooves M3 can be suppressed.

Next, as shown in FIGS. 13(a)-13(c) and FIGS. 14(a)-14(c), etching gas or etching liquid is brought in contact with the first single crystal semiconductor layers 12a and 12b through the grooves M2, and etching gas or etching liquid is brought in contact with the first single crystal semiconductor layers 12c and 12d through the grooves M3, whereby the first single crystal semiconductor layers 12a and 12b in the thick film semiconductor region R2 are removed by etching, and the first single crystal semiconductor layers 12c and 12d in the thin film semiconductor region R3 are removed by etching. Further, in the thick film semiconductor region R2, void sections 17 are formed between the semiconductor substrate 11 and the second single crystal semiconductor layer 13a, and between the second single crystal semiconductor layers 13a and 13b; and in the thin film semiconductor region R3, void sections 17 are formed between the second single crystal semiconductor layers 13b and 13c, and 13c and 13d.

It is noted here that, by providing the supporting bodies 16 in the grooves M1, the second single crystal semiconductor layers 13a-13d can be supported on the semiconductor substrate 11 even when the first single crystal semiconductor layers 12a-12d are removed; and by providing the grooves M2 and M3 independently of the grooves M1, etching gas or etching liquid can be brought in contact with the first single crystal semiconductor layers 12a-12d disposed under the second single crystal semiconductor layers 13a-13d, respectively. For this reason, the void sections 17 can be formed between the semiconductor substrate 11 and the second single crystal semiconductor layer 13a, and among the second single crystal semiconductor layers 13a through 13d, without damaging the crystal quality of the second single crystal semiconductor layers 13a-13d.

Also, in the thin film semiconductor region R3, the depth of the grooves M3 may be set such that the second single crystal semiconductor layer 13b remains on the first single crystal semiconductor layer 12b, whereby the first single crystal semiconductor layers 12a and 12b in the thick film semiconductor region R2 can be removed while leaving the first single crystal semiconductor layers 12a and 12b remained in the thin film semiconductor region R3. For this reason, in the thick semiconductor region R2, the second single crystal semiconductor layer 13a between the first single crystal semiconductor layers 12a and 12b can be thermally oxidized; and in the thin film semiconductor region R3, the second single crystal semiconductor layer 13a between the first single crystal semiconductor layers 12a and 12b can be prevented from being thermally oxidized, and the second single crystal semiconductor layer 13c disposed in a layer above the second single crystal semiconductor layer 13a can be thermally oxidized. As a result, the height of a dielectric layer 18 that is formed by thermal oxidation of the second single crystal semiconductor layers 13a-13d can be made different in the thick film semiconductor region R2 and the thin film semiconductor region R3, and the film thickness of the second single crystal semiconductor layers can be made different in the thick film semiconductor region R2 and the thin film semiconductor region R3.

It is noted that, when the semiconductor substrate 11, the second single crystal semiconductor layers 13a-13d and the supporting body 16 consist of Si, and the first single crystal semiconductor layers 12a-12d consist of SiGe, it is desirable to use nitric-hydrofluoric acid as an etching liquid for the first single crystal semiconductor layers 12a-12b. By this, a selection ratio between Si and SiGe that ranges from about 1:1000 to 1:10000 can be obtained, such that the first single crystal semiconductor layers 12a-12d can be removed while suppressing over-etching of the semiconductor substrate 11, the second single crystal semiconductor layers 13a-13d and the supporting body 16.

Next, as shown in FIGS. 15(a)-15(b) and 16(a)-16(c), the semiconductor substrate 11, the second single crystal semiconductor layers 13a-13d and the supporting body 16 are thermally oxidized until the second single crystal semiconductor layer 13a in the thick film semiconductor region R2 and the second single crystal semiconductor layer 13c in the thin film semiconductor region R3 disappear, thereby forming dielectric layers 18 under the second single crystal semiconductor layer 13b in the thick film semiconductor region R2 and under the second single crystal semiconductor layer 13d in the thin film semiconductor region R3. It is noted here that, by having the second single crystal semiconductor layer 13a in the thick film semiconductor region R2 disappear, gaps between the second single crystal semiconductor layer 13b and the semiconductor substrate 11 can be completely embedded with the dielectric layers 18 in the thick film semiconductor region R2. Also, by having the second single crystal semiconductor layer 13c in the thin film semiconductor region R3 disappear, gaps between the second single crystal semiconductor layers 13b and 13d can be completely embedded with the dielectric layers 18 in the thin film semiconductor region R3.

For this reason, while maintaining the crystal quality of the second single crystal semiconductor layers 13b and 13d, the heights of the dielectric layers 18 to be disposed can be made different from one another in the thick film semiconductor region R2 and the thin film semiconductor region R3; in the thick film semiconductor region R2, the second single crystal semiconductor layers 13b and 13d can be disposed on the dielectric layers 18; and in the thin film semiconductor region R3, the second single crystal semiconductor layer 13d can be disposed on the dielectric layer 18. As a result, the film thickness of the second single crystal semiconductor layers can be set to match with different usages of semiconductor elements, respectively, and semiconductor elements for mutually different usages can be formed on a common semiconductor substrate 11.

Also, the film thicknesses of the second single crystal semiconductor layers 13b and 13d after element isolation can be defined by the film thicknesses of the second single crystal semiconductor layers 13a-13d at the time of epitaxial growth and the film thickness of the dielectric layer 18 formed at the time of thermal oxidation of the second single crystal semiconductor layers 13a-13d. For this reason, the film thicknesses of the second single crystal semiconductor layers 13b and 13d can be accurately controlled, differences in the film thicknesses of the second single crystal semiconductor layers 13b and 13d can be reduced, and the heights of the dielectric layers 18 to be disposed can be made different from one another in the thick film semiconductor region R2 and the thin film semiconductor region R3. Also, by providing the oxidation prevention film 15 on the second single crystal semiconductor layer 13d, the surface of the second single crystal semiconductor layer 13d can be prevented from being oxidized, and the dielectric layer 18 can be formed below the second single crystal semiconductor layer 13b or the second single crystal semiconductor layer 13d.

Further, by forming the dielectric layers 18 in a manner to embed the void sections 17, the second single crystal semiconductor layers 13b and 13d can be disposed in a self-alignment manner between the element isolation regions. For this reason, in the thick film semiconductor region R2 and the thin film semiconductor region R3, while lacks or duplicates of the second single crystal semiconductor layers 13b and 13d can be prevented, the film thicknesses of the second single crystal semiconductor layers can be made different from one another for individual usages of semiconductor elements, such that higher integration and higher reliability of semiconductor elements can be achieved.

It is noted here that the first single crystal semiconductor layers 12a-12b may be formed in the same film thickness, and the film thickness of the second single crystal semiconductor layer 13a may be set to about 70% of the film thickness of the first single crystal semiconductor layers 12a-12b, whereby the film thickness of the dielectric layer 18 under the second single crystal semiconductor layer 13b in the thick film semiconductor region R2 can be made generally equal to the total film thickness of the first single crystal semiconductor layer 12a, the second single crystal semiconductor layer 13a and the first single crystal semiconductor layer 12b. For this reason, while stress on the dielectric layers 18 can be suppressed, the void sections 17 in the thick film semiconductor region R2 can be completely closed with the dielectric layers 18, an increase in the thermal resistance can be suppressed, and deterioration of the crystallinity of the second single crystal semiconductor layer 13c on the dielectric layer 18 can be suppressed. Further, by setting the film thickness of the second single crystal semiconductor layer 13a to less than 70% of the film thickness of the first single crystal semiconductor layers 12a-12b, areas below the second single crystal silicon layer 13b in the thick film semiconductor region R2 are formed with the dielectric layer 18 and the voids, whereby deterioration of the crystallinity of the second single crystal semiconductor layer 13c on the dielectric layer 18 can be suppressed, though resistance to the thermal conductivity may become greater.

On the other hand, if the film thickness of the second single crystal semiconductor layer 13a is set to a value that greatly exceeds 70% of the film thickness of the first single crystal semiconductor layer 12c, the film thickness of the dielectric layer 18 under the second single crystal semiconductor layer 13b in the thick film semiconductor region R2 can be made greater than the total film thickness of the first single crystal semiconductor layer 12a, the second single crystal semiconductor layer 13a and the first single crystal semiconductor layer 12b. For this reason, the second single crystal semiconductor layers 13b and 13d in the thick film semiconductor region R2 can be lifted up, and the flatness between the thick film semiconductor region R2 and the thin film semiconductor region R3 can be improved.

After the dielectric layer 18 is formed, high-temperature annealing is conducted. By this, the dielectric layer 18 can be re-flowed, stresses on the dielectric layer 18 can be alleviated, and the interface state can be reduced.

Next, as shown in FIGS. 17(a)-17(b) and FIGS. 18(a)-18(c), by using a CVD method or the like, a dielectric layer 19 is deposited on the oxidation prevention film 15 in a manner that the grooves M1-M3 with the dielectric layer 18 formed on their side walls are embedded. It is noted that, for example, $SiO_2$ or $Si_3N4$ may be used as the dielectric layer 10.

Next, as shown in FIGS. 19(a)-19(b) and FIGS. 20(a)-20(c), the dielectric layer 19 is planarized by using a CMP (chemical mechanical polishing) method or the like, to thereby expose a surface of the oxidation prevention film 15 and embed the dielectric layer 19 in the grooves M1-M3.

Next, as shown in FIGS. 21-FIGS. 24, the oxidation prevention film 15 and the sacrificial oxidation film 14 on the second single crystal semiconductor layer 13d are removed, to thereby expose a surface of the second single crystal semiconductor layer 13d, which has been keep clean and damage free.

Next, as shown in FIGS. 25(a)-25(b) and FIGS. 26(a)-26(c), ions are selectively injected in the second single crystal semiconductor layer 13d in the non-BOX layer region R1 to form impurity diffusion layers 22c, thereby forming protection diodes in the non-BOX layer region R1.

Also, in the thick film semiconductor region R2 and the thin film semiconductor region R3, the surface of the second single crystal semiconductor layer 13d is thermally oxidized; and in the thin film semiconductor region R3, the thermally oxidized film of the second single crystal semiconductor layer 13d is selectively removed; and then again, in the thick film semiconductor region R2 and the thin film semiconductor region R3, the surface of the second single crystal semiconductor layer 13d is thermally oxidized, whereby thick gate dielectric films 20a and thin gate dielectric films 20b are formed on the second single crystal semiconductor layer 13d, respectively. Then, by using a photolithography technique and an etching technique, the polycrystalline silicon film is patterned to form gate electrodes 21a and 21b over the second single crystal semiconductor layer 13d. Then, by using the gate electrodes 2a and 21b as a mask, impurity ions are injected in the second single crystal semiconductor layer 13d, to thereby form source/drain layers 22a and 22b disposed at sides of the gate electrodes 21a and 21b, respectively, in the second single crystal semiconductor layer 13d. When the acceleration energy is set such that the injected impurity ions enter a position deeper than the semiconductor film thickness in the thin semiconductor region R3, the source/drain 22a with a greater amount of impurity and in a deeper junction depth and the source/drain 22b in a shallower junction depth can be simultaneously formed by a single step of injection.

By this, in the thin film semiconductor region R3, when the effective channel length of a high-speed/lower power semiconductor element is 0.1 µm or less, the film thickness of the second single crystal semiconductor layer 13d can be made to 50 nm or less, whereby a completely depleted type SOI transistor in which the short-channel effect is suppressed can be formed.

Also, in the thick film semiconductor region R2, the second single crystal semiconductor layer 13b can be provided between the second single crystal semiconductor layer 13d and the dielectric layer 18, such that the film thickness of the second single crystal semiconductor layer can be increased. For this reason, a partially depleted type SOI transistor can be formed, while securing a high junction breakdown voltage and a large current capacity.

Furthermore, in the non-BOX layer region R1, the BOX layer can be omitted, such that semiconductor elements in which a large current circulates can be formed while maintaining the performance and reliability of the semiconductor elements. It is noted that, besides protection diodes, bipolar transistors, trench memory cells or the like may preferably be formed in the non-BOX layer region R1.

What is claimed is:

1. A method for manufacturing a semiconductor substrate comprising:

a step of forming, on a semiconductor base, a first laminated layered structure composed of a second semiconductor layer having a smaller selection ratio at etching than a first semiconductor layer, laminated on the first semiconductor layer;

a step of forming, in a part of an area on the first laminated layered structure, a second laminated layered structure composed of a fourth semiconductor layer having a smaller selection ratio at etching than a third semiconductor layer, laminated on the third semiconductor layer;

a step of forming a first groove that penetrates the first semiconductor layer through the fourth semiconductor layer and exposes the semiconductor base;

a step of forming a supporting body for supporting the second and fourth semiconductor layers on the semiconductor base on side walls of the first semiconductor layer through the fourth semiconductor layer in the first groove;

a step of forming, in a first area divided by the first groove, a second groove that exposes at least a part of the first semiconductor layer through the second semiconductor layer;

a step of forming, in a second area divided by the first groove, a third groove that exposes at least a part of the third semiconductor layer through the fourth semiconductor layer;

a step of forming void sections under the second and fourth semiconductor layers by selectively etching the first and third semiconductor layers through the second groove and the third groove; and a step of forming dielectric layers disposed below the second and fourth semiconductor layers by thermally oxidizing the second and fourth semiconductor layers through the void sections.

2. A method for manufacturing a semiconductor substrate according to claim 1, characterized in that the second semiconductor layer, the fourth semiconductor layer and the supporting body consist of single crystal Si, and the first semiconductor layer and the third semiconductor layer consist of single crystal SiGe.

3. A method for manufacturing a semiconductor device comprising:

- a step of forming, on a semiconductor substrate, a first laminated layered structure composed of a second semiconductor layer having a smaller selection ratio at etching than a first semiconductor layer, laminated on the first semiconductor layer;
- a step of forming, in a part of an area on the first laminated layered structure, a second laminated layered structure composed of a fourth semiconductor layer having a smaller selection ratio at etching than a third semiconductor layer, laminated on the third semiconductor layer;
- a step of forming a first groove that penetrates the first semiconductor layer through the fourth semiconductor layer and exposes the semiconductor substrate;
- a step of forming a supporting body for supporting the second and fourth semiconductor layers on the semiconductor substrate on side walls of the first semiconductor layer through the fourth semiconductor layer in the first groove;
- a step of forming, in a first area divided by the first groove, a second groove that exposes at least a part of the first semiconductor layer through the second semiconductor layer;
- a step of forming, in a second area divided by the first groove, a third groove that exposes at least a part of the third semiconductor layer through the fourth semiconductor layer;
- a step of forming void sections under the second and fourth semiconductor layers by selectively etching the first and third semiconductor layers through the second groove and the third groove;
- a step of forming dielectric layers disposed below the second and fourth semiconductor layers by thermally oxidizing the second and fourth semiconductor layers through the void sections; and
- a step of forming semiconductor elements of different usages under the second and fourth semiconductor layers, respectively.

* * * * *